(12) United States Patent
Klovning et al.

(10) Patent No.: US 11,581,864 B2
(45) Date of Patent: *Feb. 14, 2023

(54) TOUCHLESS INTERACTION USING AUDIO COMPONENTS

(71) Applicant: Elliptic Laboratories AS, Oslo (NO)

(72) Inventors: Espen Klovning, Strømmen (NO);
John Magne Helgesen Røe, Sørumsand (NO); Thomas Kristoffersen Børstad, Oslo (NO)

(73) Assignee: Elliptic Laboratories AS, Oslo (NO)

( * ) Notice: Subject to any disclaimer, the term of this patent is extended or adjusted under 35 U.S.C. 154(b) by 0 days.

This patent is subject to a terminal disclaimer.

(21) Appl. No.: 17/467,588

(22) Filed: Sep. 7, 2021

(65) Prior Publication Data

US 2021/0408991 A1 Dec. 30, 2021

Related U.S. Application Data

(63) Continuation of application No. 17/436,203, filed as application No. PCT/NO2020/050058 on Mar. 5, 2020.

(30) Foreign Application Priority Data

Mar. 15, 2019 (NO) .................... 20190356

(51) Int. Cl.
*G06F 3/043* (2006.01)
*H03G 3/34* (2006.01)
*H04R 3/00* (2006.01)

(52) U.S. Cl.
CPC ............... *H03G 3/34* (2013.01); *H04R 3/002* (2013.01); *G06F 3/043* (2013.01); *H04R 2430/01* (2013.01)

(58) Field of Classification Search
CPC .......... G06F 3/017; G06F 3/043; H03G 3/34; H04R 3/007
See application file for complete search history.

(56) References Cited

U.S. PATENT DOCUMENTS 7,053,704 B2 * 5/2006 Forel .................... H03F 1/305
330/69
9,699,288 B1 * 7/2017 Chien .................. G10L 21/003
(Continued)

FOREIGN PATENT DOCUMENTS

CN 106896362 A 6/2017
JP 2004-289280 A 10/2004

OTHER PUBLICATIONS

Versini, Pascal; International Search Report; PCT/NO2020/050058; dated May 28, 2020; 3 pages.

*Primary Examiner* — Olga V Merkoulova
(74) *Attorney, Agent, or Firm* — Shackelford, Bowen, McKinley & Norton, LLP

(57) ABSTRACT

The present teachings relate to an electronic device comprising: a first module for generating an audio signal; a second module for generating an ultrasonic signal; a mixer for generating a combined signal; a transmitter for outputting an acoustic signal dependent upon the combined signal; and, a processing means for controlling the ultrasonic signal; wherein, in response to receiving a first instruction signal for initiating the ultrasonic signal, the processing means is configured to increase the amount of the ultrasonic signal in the combined signal from an essentially zero value to a predetermined value over a predetermined enable time-period. The present teachings also relate to an electronic device configured to decrease the amount of the ultrasonic signal in the combined signal from an essentially zero value to a predetermined value over a predetermined disable time-period, and to an electronic device configured to remove the audio signal from the combined signal whilst (Continued)

preventing pop-noise, and to an electronic device capable of replacing the ultrasonic signal whilst minimizing the processing time. The present teachings further relate to a method for reducing the occurrence of pop noise in an acoustic signal associated with: initiating the ultrasonic signal in the combined signal, terminating the ultrasonic signal in the combined signal, terminating the audio signal in the combined signal, and replacing the ultrasonic signal in the combined signal. The present teachings also relate to a computer software product for implementing any of the method steps disclosed herein, and to a computer storage medium storing the computer software herein disclosed.

10 Claims, 8 Drawing Sheets

(56) References Cited

U.S. PATENT DOCUMENTS

| | | | |
|---|---|---|---|
| 9,804,710 B2* | 10/2017 | Dahl | G06F 3/011 |
| 2008/0044035 A1* | 2/2008 | Agrawal | H04M 1/72403 |
| | | | 381/71.1 |
| 2011/0002474 A1 | 1/2011 | Fuller | |
| 2011/0103614 A1* | 5/2011 | Cheung | G10L 21/0208 |
| | | | 381/94.1 |
| 2014/0043943 A1* | 2/2014 | Lavery | G01S 1/751 |
| | | | 367/118 |
| 2014/0192622 A1 | 7/2014 | Rowe et al. | |
| 2016/0026340 A1* | 1/2016 | Dahl | G06F 3/0433 |
| | | | 345/177 |
| 2017/0168158 A1 | 6/2017 | Reining | |
| 2022/0129092 A1* | 4/2022 | Klovning | G01S 7/534 |

* cited by examiner

TOUCHLESS INTERACTION USING AUDIO COMPONENTS

CROSS-REFERENCE TO RELATED APPLICATIONS

This application is a continuation of U.S. patent application Ser. No. 17/436,203, which entered the national-stage in the U.S. under 35 U.S.C. § 371 on Sep. 3, 2021. U.S. patent application Ser. No. 17/436,203 is a national-stage application of International Application No. PCT/NO2020/050058, which has an international filing date of Mar. 5, 2020. PCT/NO2020/050058 claims priority from Norwegian Patent Application No. 20190356, filed on Mar. 15, 2019. The contents of U.S. patent application Ser. No. 17/436,203, International (PCT) Application No. PCT/NO2020/050058, and Norwegian Patent Application No. 20190356 are incorporated by reference in their entirety herein for all purposes.

TECHNICAL FIELD

The present teachings relate to an electronic device which is suitable for touchless interaction.

BACKGROUND ART

Several types of electronic devices in the market today allow a user to interact with the device using a touch-based interface, such as a touchscreen. The touch-based interface is used to capture the user's touch on a touch sensitive surface for determining an input from the user, or a user input. There also exist touchless interfaces for electronic devices that allow the user to interact with the device in a touchless manner.

In handheld electronic devices such as mobile phones, the touchless interface may be used to detect proximity of an object. Accordingly, presence of objects such as a user or a body part of the user may be detected within a given distance from the device. In some cases, the touchless interface may further be used to detect gestures performed by the user.

Ultrasonic touchless technology is an example of the technology used in touchless interfaces. In principle, the ultrasonic touchless technology involves a detection based upon the transmission of ultrasonic signals and the reception of reflected ultrasonic signals reflected by one or more objects in the vicinity of the device. In some cases, an advantage of the ultrasonic touchless technology can be that existing audio components of the electronic device can be leveraged, thus obviating the requirement for additional hardware. When no audio is being output and received, the audio components may be used for ultrasonic detection alone. Ultrasonic signals lie outside the typical human audible range, so they may be superimposed on the regular audio signals, for example, music playback or during phone calls, such that ultrasonic detection may even be performed while the audio components are being used for audio playback and/or capture. JP2004289280A, U.S. Pat. No. 9,699,288B1, CN106896362A and US2011002474 describe solutions combining the use of ultrasonic and acoustic signals in the same speaker receiving ultrasonic signal used for interrogating the environment.

In many cases, the earpiece speaker, or receiver, may be used as an ultrasonic transmitter while most ordinary microphones can function as ultrasonic receivers. Thus, by using existing audio components of the electronic device and preventing the use of custom components specifically for ultrasonic detection, advantages such as lower cost and simplified product design can be achieved.

Similarly, existing audio components such as amplifiers, or codecs may also be used for amplifying or processing the ultrasonic signals. This may be done either for transmission of the ultrasonic signals and/or after reception of the reflected ultrasonic signals.

A prerequisite of using the existing audio components, such as speaker and microphone, of the electronic device for ultrasonic detection is that audio quality perceived by the user should not be affected due to ultrasonic detection operation. In other words, a typical user should not be able to perceive a difference between audio quality with and without the ultrasonic signals being transmitted and/or received through said audio components.

One of the problems that may arise in audio components is pop noise. Pop noise, or click noise is typically an audible noise that is heard when an audio component such as amplifier is switched on or off. Audio components such as amplifiers are often equipped with hardware capabilities specifically for alleviating the occurrence of such noise from audio signals. Such specific hardware capabilities may sometimes be absent or unsuitable for preventing the occurrence of pop noise due to ultrasonic signal being, started, stopped, or even mixed or combined with an audio signal. Furthermore, changing the gain or level of the ultrasonic signal may also result in an occurrence of pop noise.

Moreover, in certain cases, the processing components such as an amplifier and/or a codec may not have a knowledge of the specific signal parts because these processing components typically handle a composite signal, i.e., a combination of signals consisting of an audio signal part and an ultrasonic signal part. Even it assuming that said processing component had a noise suppression capability, it may be applied only if there is a change in the overall gain. Thus, a change in one or more specific signal parts may not be visible for the processing component, and may thus result in pop noise.

There is hence a requirement of a method, a software product implementing such a method, and an electronic device suitable for ultrasonic touchless interaction that can suppress pop noise without relying upon the availability of specific noise suppression hardware or capability.

SUMMARY

At least some problems inherent to the prior-art will be shown solved by the features of the accompanying independent claims.

When viewed from a first perspective, there can be provided an electronic device comprising:
  a first module for generating an audio signal;
  a second module for generating an ultrasonic signal;
  a mixer for generating a combined signal;
  a transmitter for outputting an acoustic signal dependent upon the combined signal; and,
  a processing means for controlling the ultrasonic signal; wherein, in response to receiving a first instruction signal for initiating the ultrasonic signal, the processing means is configured to increase the amount of the ultrasonic signal in the combined signal from an essentially zero value to a predetermined value over a predetermined enable time-period.

It will be understood that the predetermined enable time-period is such that the occurrence of pop noise in the acoustic signal due to the ultrasonic signal being initiated is reduced at least substantially.

The processing means may effect the increase in the amount of the ultrasonic signal in the combined signal via the second module, e.g., by controlling the generation of the ultrasonic signal by the second module. The processing means may thus scalably increase the ultrasonic signal over the predetermined enable time-period. Alternatively, the processing means may increase the amount of the ultrasonic signal in the combined signal via the mixer, e.g., by controlling the amount of ultrasonic signal that is combined with the audio signal. Alternatively, the processing means may increase the amount of the ultrasonic signal in the combined signal via another module. The other module may, e.g., be connected between the second module and the mixer. According to aspect, the processing means may increase the amount of the ultrasonic signal in the combined signal via any combination of the above.

According to an aspect, the enable time-period is preferably in the range from about 1 ms to around 500 ms. More preferably, the enable time-period is in the range from about 5 ms to about 50 ms within which range, the applicant has realized that the pop-noise is effectively reduced without introducing an excessive time delay. In certain cases, a value of 5 ms or approximately 5 ms for the enable time-period may be preferable. In some cases, a value of 10 ms or approximately 10 ms for the enable time-period may be preferable. The enable time-period is typically calculated with respect to the amplitude of the ultrasonic signal, i.e., the amplitude representing the amount of the ultrasonic signal. It will be understood that larger enable time-periods may be possible, although they may not be desirable due to additional time delay introduced in the processing of the ultrasonic signals.

As will be appreciated, the combined signal may comprise an, either zero or non-zero, amount of said audio signal and, an, either zero or non-zero, amount of said ultrasonic signal. More specifically, at the time the first instruction signal occurs, i.e., before the ultrasonic signal is initiated, the combined signal may comprise an, either zero or non-zero, amount of said audio signal.

Accordingly, there can also be provided an electronic device comprising:
  a first module for generating an audio signal;
  a second module configured to generate an ultrasonic signal;
  a mixer for generating a combined signal, said combined signal comprising:
    an, either zero or non-zero, amount of said audio signal and,
    an, either zero or non-zero, amount of said ultrasonic signal;
  a transmitter configured to output an acoustic signal dependent upon the combined signal; and,
  a processing means for controlling the ultrasonic signal;
wherein, in response to receiving a first instruction signal for initiating the ultrasonic signal, from an essentially zero value to a predetermined non-zero value, in the combined signal, the processing means is configured to increase the amount of the ultrasonic signal in the combined signal from the essentially zero value to the predetermined value over a predetermined enable time-period, thereby at least substantially reducing the occurrence of pop noise in the acoustic signal due to the ultrasonic signal being initiated.

It will be clear that the audio signal, the ultrasonic signal, and the combined signal are electrical signals, which are converted to the acoustic signal. More specifically, when a non-zero amount of ultrasonic signal is present in the combined signal, it is converted to an ultrasonic component of the acoustic signal. Similarly, when a non-zero amount of audio signal present in the combined signal, it is converted to an audio component of the acoustic signal. It will further be understood that the combined signal when generated may comprise either one or both of:
the audio signal, and
the ultrasonic signal,
dependent upon the state of the electronic device.

Accordingly, as it will be clear, the operating modes or conditions of the transmitter include transmitting either one or both of:
  the audio component dependent upon a non-zero amount of the audio signal, and
  the ultrasonic component dependent upon a non-zero amount the ultrasonic signal.

By saying, over a time-period, it will be clear that the corresponding operation is started at the beginning of the time-period and completed at the end of that time-period. In a very simple sense, it can be imagined that the operation is ramped within the extremities of the time-period. By saying ramped, it is also intended to cover not only a linear progression in a given direction, but also progression in a plurality of discrete steps which permit that pop or click noise is mitigated in the acoustic signal. The term ramped, e.g., ramp up or ramp down, in this context is thus also intended to encompass especially lower order exponential or a complex exponential progression of the action within the corresponding time-period.

As discussed, the applicant has realized that by ramping up, over the enable time-period, the amount of ultrasonic signal from zero or essentially a zero value to a desired predetermined value, the pop noise contribution due to the initiation of the ultrasonic signal may be substantially reduced or essentially eliminated. The acoustic signal generated by the transmitter by using the combined signal can hence prevent a typical user from hearing such pop or click noise. Accordingly, the audio quality can thus be maintained by implementing the present teachings.

As stated previously, it will be appreciated that for the above initiation of the ultrasonic signal, the audio signal may be present in the combined signal or it may be absent, i.e., the combined signal may comprise either zero or non-zero, amount of the audio signal. As it would already be clear, the first module is configured to generate the audio signal when the combined signal comprises a non-zero amount of said audio signal.

It will be understood that the term transmitter is used in a general sense to encompass any kind of transducer, such as a speaker, capable of transmitting audio and ultrasonic signals. Accordingly, the transmitter may be any kind of speaker or electromechanical device which can produce acoustic signals in the audible range, as well as in ultrasonic range. The speaker may be loudspeaker, piezoelectric speaker, or such device. In other words, the speaker is an electromechanical transducer capable of converting an electrical signal to an acoustic signal. In context of the above, the combined signal is the electrical signal.

The applicant has further realized a way to reduce the pop noise contribution due to stopping or removal of the ultrasonic signal from the combined signal. Hence, when viewed from a second perspective, there can be also be provided an electronic device comprising:
  a first module for generating an audio signal;
  a second module for generating an ultrasonic signal;
  a mixer for generating a combined signal;
  a transmitter for outputting an acoustic signal dependent upon the combined signal; and, a processing means for controlling the ultrasonic signal; wherein, in response to receiving a second instruction signal for terminating the ultrasonic signal, the processing means is configured to decrease the amount of the ultrasonic signal in the combined signal from a predetermined value to an essentially zero value over a predetermined disable time-period.

It will be understood that the predetermined disable time-period is such that the occurrence of pop noise in the acoustic signal due to the ultrasonic signal being stopped or terminated is reduced at least substantially.

As discussed previously, the processing means may effect the decrease in the amount of the ultrasonic signal in the combined signal via the second module, e.g., by controlling the generation of the ultrasonic signal by the second module. The processing means may thus scalably decrease the generation of the ultrasonic signal over the predetermined disable time-period. Alternatively, the processing means may decrease the amount of the ultrasonic signal in the combined signal via the mixer, e.g., by controlling the amount of ultrasonic signal that is combined with the audio signal. Alternatively, the processing means may decrease the amount of the ultrasonic signal in the combined signal via any another module. The any another module may, e.g., be connected between the second module and the mixer. According to aspect, the processing means may decrease the amount of the ultrasonic signal in the combined signal via any combination of the above.

It will further be understood that the processing means may effect the increase/decrease in the amount of the ultrasonic signal in the combined signal by sending one of more instructions or control signals to the respective one or more modules and/or the mixer.

The disable time-period may be equal to the enable time-period or they may be different values. Thus, according to an aspect, the disable time-period is preferably in the range from about 1 ms to around 500 ms. More preferably, the disable time-period is in the range from about 5 ms to about 50 ms within which range, the applicant has realized that the pop-noise is effectively reduced without introducing an excessive time delay. In certain cases, a value of 5 ms or approximately 5 ms for the disable time-period may be preferable. In some cases, a value of 10 ms or approximately 10 ms for the disable time-period may be preferable. The disable time-period is typically calculated with respect to the amplitude of the ultrasonic signal, i.e., the amplitude representing the amount of the ultrasonic signal. It will be understood that larger disable time-periods may be possible, although they may not be desirable due to additional time delay introduced in the processing of the ultrasonic signals.

As before, it will be appreciated, the combined signal may comprise an, either zero or non-zero, amount of said audio signal and, an, either zero or non-zero, amount of said ultrasonic signal. More specifically, at the time the second instruction signal occurs, i.e., when the ultrasonic signal is present in the combined signal, the combined signal may comprise an, either zero or non-zero, amount of said audio signal.

Accordingly, there can be also be provided an electronic device comprising:
  a first module for generating an audio signal;
  a second module configured to generate an ultrasonic signal;
  a mixer configured to generate a combined signal, said combined signal comprising:
    an, either zero or non-zero, amount of said audio signal and,
    an, either zero or non-zero, amount of said ultrasonic signal;
  a transmitter configured to output an acoustic signal dependent upon the combined signal; and,
  a processing means for controlling the ultrasonic signal;
wherein, in response to receiving a second instruction signal for terminating the ultrasonic signal, from a predetermined non-zero value, in the combined signal, the processing means is configured to decrease the amount of the ultrasonic signal from the predetermined value to an essentially zero value over a predetermined disable time-period, thereby at least substantially reducing the occurrence of pop noise in the acoustic signal due to the ultrasonic signal being terminated or removed from the combined signal.

It will be understood that the first and the second perspectives may be combined such that there can be also be provided an electronic device comprising:
  a first module for generating an audio signal;
  a second module configured to generate an ultrasonic signal;
  a mixer for generating a combined signal;
  a transmitter configured to output an acoustic signal dependent upon the combined signal; and,
  a processing means for controlling the ultrasonic signal;
wherein, in response to receiving a first instruction signal for initiating the ultrasonic signal, the processing means is configured to:
  increase the amount of the ultrasonic signal in the combined signal from an essentially zero value to a predetermined enable value over a predetermined enable time-period; and
in response to receiving a second instruction signal for terminating the ultrasonic signal, the processing means is configured to:
  decrease the amount of the ultrasonic signal from a predetermined disable value to an essentially zero value over a predetermined disable time-period.

The enable time-period and the disable time-period can be as were discussed previously, i.e., they are such that the occurrence of pop noise in the acoustic signal due to the ultrasonic signal being initiated and due to the ultrasonic signal being stopped or terminated is reduced at least substantially.

The combined signal is also as discussed previously, notably, the combined signal at any point may comprise an, either zero or non-zero, amount of said audio signal and, an, either zero or non-zero, amount of said ultrasonic signal.

Accordingly, there can also be provided an electronic device comprising:
  a first module for generating an audio signal;
  a second module configured to generate an ultrasonic signal;
  a mixer for generating a combined signal, said combined signal comprising:
    an, either zero or non-zero, amount of said audio signal and,
    an, either zero or non-zero, amount of said ultrasonic signal;
  a transmitter configured to output an acoustic signal dependent upon the combined signal; and,
  a processing means for controlling the ultrasonic signal;
wherein, in response to receiving a first instruction signal for initiating the ultrasonic signal, from an essentially zero value to a predetermined non-zero enable value, in the combined signal, the processing means is configured to:
  increase the amount of the ultrasonic signal in the combined signal from the essentially zero value to the predetermined enable value over a predetermined enable time-period, thereby at least substantially reducing the occurrence of pop noise in the acoustic signal due to the ultrasonic signal being initiated; and in response to receiving a second instruction signal for terminating the ultrasonic signal, from a predetermined non-zero disable value, in the combined signal, the processing means is configured to:

decrease the amount of the ultrasonic signal from the predetermined disable value to an essentially zero value over a predetermined disable time-period, thereby at least substantially reducing the occurrence of pop noise in the acoustic signal due to the ultrasonic signal being terminated or removed from the combined signal.

It will be appreciated that the predetermined enable value and the predetermined disable value can either be the same value, i.e., they can be equal to the predetermined value, or they can be different values. For example, if during the operation, the amount of ultrasonic signal was changed to a different value, then the predetermined enable value and the predetermined disable value can be different values.

According to an aspect the first instruction signal is an ultrasonic enable signal. Similarly, the second instruction signal may be an ultrasonic disable signal. The ultrasonic enable signal and the ultrasonic disable signal may be the same ultrasonic control signal or they may be different signals. The ultrasonic control signal may comprise an enable state and a disable state, wherein the ultrasonic signal is initiated when the ultrasonic control signal is in the enable state, and the ultrasonic signal is terminated when the ultrasonic control signal is in the disable state. The ultrasonic control signal can, for example, be a binary signal representing the enable state and the disable state according to the respective binary states.

The applicant has further realized that a termination or removal of the audio signal while a non-zero amount of ultrasonic signal is present in the combined signal, i.e., when the combined signal comprises non-zero ultrasonic signal, can also result in an occurrence of pop or click noise. Accordingly, when viewed from a third perspective there can be also be provided an electronic device comprising:

a first module for generating an audio signal;
a second module for generating an ultrasonic signal;
a mixer for generating a combined signal;
a transmitter for outputting an acoustic signal dependent upon the combined signal; and,
a processing means for controlling:
the ultrasonic signal; and
the audio signal;

wherein, in response to receiving a third instruction for terminating the audio signal, the processing means is configured to:

decrease the amount of the ultrasonic signal, in the combined signal, from a predetermined value to an essentially zero value over a predetermined disable time-period; and
upon expiry of the predetermined disable time-period, terminate or remove the audio signal from the combined signal.

It will be understood that in this case, the predetermined value of the ultrasonic signal is a non-zero value, i.e., the ultrasonic signal is present in the combined signal.

As was discussed previously, the predetermined disable time-period is such that the occurrence of pop noise in the acoustic signal due to the ultrasonic signal being stopped or terminated is reduced at least substantially.

Other features and values can be as were discussed previously.

It is assumed above that disabling the audio part itself does not require an explicit specification of pop noise compensation. The present teachings especially address the scenarios where an ultrasonic signal is generated using the existing audio components before, after or while audio signals are being processed by said components. As mentioned previously, the audio components such as amplifiers are often equipped with hardware capabilities specifically for alleviating the occurrence of such noise, so it will be appreciated that by saying above that thereby at least substantially reducing the occurrence of pop noise in the acoustic signal due to the audio being stopped or paused, the skilled person will understand that pop noise for the audio signal itself is dealt with by one or more of the audio components themselves. However, if required, the audio signal may also be ramped down in a similar manner.

There can be also be provided an electronic device comprising:

a first module configured to generate an audio signal;
a second module configured to generate an ultrasonic signal;
a mixer configured to generate a combined signal, said combined signal comprising:
an, either zero or non-zero, amount of said audio signal and,
an, either zero or non-zero, amount of said ultrasonic signal;
a transmitter configured to output an acoustic signal dependent upon the combined signal; and,
a processing means for controlling:
the ultrasonic signal; and
the audio signal;

wherein, in response to receiving a third instruction for terminating the audio signal, from a non-zero value, in the combined signal, the processing means is configured to:

decrease the amount of the ultrasonic signal, in the combined signal, from a predetermined value to an essentially zero value over a predetermined disable time-period; and
upon expiry of the predetermined disable time-period, terminate or remove the audio signal from the combined signal, thereby at least substantially reducing the occurrence of pop noise in the acoustic signal due to the audio being terminated from the combined signal.

As it will be understood, the third instruction for terminating the audio signal, in other words interrupting the audio signal by stopping or pausing, may be initiated by a user of the electronic device, for example, when the user pauses or stops an audio track being played through the transmitter or speaker. Alternatively, the third instruction may be initiated by a module of the electronic device in response to a change is state of the electronic device. The third instruction may even be initiated by a change in the use case of the electronic device. For example, when the electronic device is a device such as a mobile phone, and when the phone starts ringing due to an incoming call while music is being played through a speaker. In such a case, the phone may interrupt the music, for example, for playing a ringtone. Other examples are, in case of an alarm, or even notification that requires the audio being played to be interrupted.

The ways in which the signals may be initiated and terminated can be as discussed previously, e.g., via their respective modules or via the mixer, etc.

The applicant has realized that, as specified above, by ramping down the amount of said ultrasonic signal from a predetermined value to zero or an essentially zero value, the pop noise contribution due to removal of the audio signal from the combined signal may be substantially reduced or essentially eliminated. The acoustic signal generated by the transmitter as a result of outputting the combined signal controlled as above can hence prevent a typical user from hearing such pop or click noise. Accordingly, the audio quality can thus be maintained by implementing the present teachings.

According to another aspect, a predetermined time delay is inserted between the expiry of the predetermined disable time-period and the termination of the audio signal in the combined signal. This can further allow additional flexibility in selecting the predetermined disable time-period i.e., a suitable ramp down period, and ensuring that the amount of audio signal becomes essentially zero or is removed altogether from the combined signal.

According to an aspect, as was discussed previously, the increase in the amount of said ultrasonic signal from an essentially zero value to the predetermined value over the enable time-period, or the ramping up of said ultrasonic signal, is an increase in the amplitude of the ultrasonic signal from an essentially zero amplitude value to a predetermined amplitude value over the enable time-period. Alternatively, the increase in the amount may even correspond to another parameter, such as an increase in the power of the ultrasonic signal from an essentially zero power value to a predetermined power value over the enable time-period. The increase may even correspond or be specified as an increase in the peak-to-peak ("p-p") value of the ultrasonic signal.

Furthermore, the decrease in the amount of said ultrasonic signal from the predetermined value to an essentially zero value over the predetermined disable time-period, or the ramping down of said ultrasonic signal, may correspond to a decrease in the amplitude of the ultrasonic signal from a predetermined amplitude value to an essentially zero amplitude value over the predetermined disable time-period, or it may be a decrease in the power of the ultrasonic signal from a predetermined power value to an essentially zero power value over the predetermined disable time-period. The decrease may even correspond or be specified as a decrease in the peak-to-peak value of the ultrasonic signal.

A suitable corresponding enable or disable time-period can thus be found for the respective parameter that prevents an occurrence of pop noise in the acoustic signal due to the ultrasonic signal being initiated or terminated respectively.

It will thus be understood that the amounts of signals and values thereof mentioned herein pertain to a real-time parameter related to the corresponding signal, such as one or more of: amplitude, p-p value, power. Furthermore, the predetermined values may be specified as an instantaneous value or parameter of the respective signal, or an average value thereof for a specific time-period.

It will further be clear that by saying, a zero amount of a given signal, it is meant that the signal is practically absent, or it is not being generated, outputted or transmitted.

According to an aspect, as it was discussed previously, the increase in the amount of said ultrasonic signal is effected by the processing means via the second module. Alternatively, the increase in the amount of said ultrasonic signal may be effected via the mixer. Further alternatively, the increase in the amount of said ultrasonic signal may be effected via another module between the second module and the mixer. The increase may even be effected by any of the combination of, via the second module, the mixer, an another module. The increase may be effected by the processing means by configuring an increase control signal, such as a gain control signal, either of the second module and/or that of the mixer and/or the another module. According to an aspect, the increase in the amount of said ultrasonic signal is in relationship with a level of an increase gain control signal, for example, the increase in the amount of said ultrasonic signal may be proportional to the level of the increase gain control signal. Alternatively, the increase may be inversely proportional to the level of the increase gain control signal. The relationship may even be another mathematical function.

Similar, to the above, the decrease in the amount of said ultrasonic signal may be effected by the processing means via the second module, or via the mixer, or via another module, or by any of their combination. Similarly to the above, the decrease may be effected by a decrease control signal, such as a gain control signal, either of the second module and/or that of the mixer, and/or of the another module. Similarly, according to another aspect, the decrease in the amount of said ultrasonic signal may be in any mathematical relationship with a level of a decrease gain control signal: proportional, inversely proportional, or another.

The increase control signal and the decrease control signal may be controlled directly by the processing means, or it may be controlled by the processing means via other module in the electronic device functionally coupled to the processing means.

According to yet another aspect, in cases where is required to resume the ultrasonic transmission after terminating the audio signal, the processing means, in response to receiving a fourth instruction signal for resuming generation of the ultrasonic signal in the combined signal, is further configured to:

increase the amount of said ultrasonic signal from an essentially zero value to a predetermined value over a re-enable time-period. Thereby at least the occurrence of pop noise in the acoustic signal due to the ultrasonic signal being resumed can be substantially reduced.

The re-enable time-period can either have the same value as the enable time-period, or the disable time-period, or it can be a different value as outlined before in this disclosure. Thus, according to an aspect, the re-enable time-period is preferably in the range from about 1 ms to around 500 ms. More preferably, the re-enable time-period is in the range from about 5 ms to about 50 ms within which range, the applicant has realized that the pop-noise is effectively reduced without introducing an excessive time delay. In certain cases, a value of 5 ms or approximately 5 ms for the re-enable time-period may be preferable. In some cases, a value of 10 ms or approximately 10 ms for the re-enable time-period may be preferable. Like other time periods specified in this disclosure, the re-enable time-period is also typically calculated with respect to the amplitude of the ultrasonic signal, i.e., the amplitude representing the amount of the ultrasonic signal. It will be understood that larger re-enable time-periods may be possible, although they may not be desirable due to additional time delay introduced in the processing of the ultrasonic signals.

Similar to the increase in the amount of said ultrasonic signal from an essentially zero value to the predetermined value over the enable time-period, the increase in the amount of ultrasonic signal over the re-enable time may be specified as an amount of amplitude, power or p-p value.

The applicant has also realized that a change in some of the properties of the ultrasonic signal while a non-zero amount of ultrasonic signal is present in the combined signal, i.e., the combined signal comprises non-zero ultrasonic signal, can also result in an occurrence of pop or click noise, irrespective of the audio signal being present or not in the combined signal. The change in the ultrasonic signal or the change in the properties of the ultrasonic signal may also be viewed as the ultrasonic signal being replaced by a second ultrasonic signal. Examples of such a change in properties can be, changing the frequency of the ultrasonic signal, changing the phase of the ultrasonic signal, or even a relatively large change in the amplitude or p-p value of the amount of said ultrasonic signal within a short period of time. Those skilled in the art will appreciate that such changes can be effected, for example, for finding a favorable set of operating parameters for the ultrasonic signal for avoiding ambient noise region, etc.

Accordingly, when viewed from a fourth perspective there can be also be provided an electronic device comprising:
- a first module for generating an audio signal;
- a second module for generating an ultrasonic signal;
- a third module for generating a second ultrasonic signal;
- a mixer for generating a combined signal;
- a transmitter for outputting an acoustic signal dependent upon the combined signal; and,
- a processing means for controlling:
  - the ultrasonic signal; and
  - the second ultrasonic signal;

wherein, in response to receiving a fifth instruction for replacing the ultrasonic signal, the processing means is configured to:
- decrease in the amount of the ultrasonic signal from a predetermined value to an essentially zero value, the decrease being executed over a predetermined disable time-period; and
- essentially simultaneously to initiating the decrease in the amount of said ultrasonic signal, initiate an increase in the amount of said second ultrasonic signal in the combined signal, said amount of said second ultrasonic signal being increased from an essentially zero value to a predetermined second value over a predetermined replace time-period.

The predetermined disable time-period may have the same value as the predetermined replace time-period, or they can be different values. The range of the time periods or their values may be similar to those discussed previously. Thus, according to an aspect, the replace time-period is preferably in the range from about 1 ms to around 500 ms. More preferably, the replace time-period is in the range from about 5 ms to about 50 ms within which range, the applicant has realized that the pop-noise is effectively reduced without introducing an excessive time delay. In certain cases, a value of 5 ms or approximately 5 ms for the replace time-period may be preferable. In some cases, a value of 10 ms or approximately 10 ms for the replace time-period may be preferable. The replace time-period is typically calculated with respect to the amplitude of the ultrasonic signal, i.e., the amplitude representing the amount of the ultrasonic signal. It will be understood that larger replace time-periods may be possible, although they may not be desirable due to additional time delay introduced in the processing of the ultrasonic signals.

It will be understood that the initiation of the decrease in the amount of said ultrasonic signal can be triggered by the ultrasonic disable signal as outlined previously. Thus, according to an aspect, the generation of the ultrasonic signal is terminated in response to an ultrasonic disable signal. Similarly, the generation of the second ultrasonic signal can be initiated by a second ultrasonic enable signal. Furthermore, as outlined in the previous perspectives, the generation of the ultrasonic signal may be enabled in response to an ultrasonic enable signal. Also, the generation of the second ultrasonic signal may be terminated in response to a second ultrasonic disable signal. Or more generally, any of the modules specified above may have corresponding enable and/or disable signals that are used for initiating/terminating the generation of the respective signals.

Other features and the values of the time-periods can be similar to those as discussed before. As was discussed previously, the replace time-period is such that the occurrence of pop noise in the acoustic signal due to the ultrasonic signal being changed is reduced at least substantially.

Accordingly, there can be also be provided an electronic device comprising:
- a first module for generating an audio signal;
- a second module configured to generate an ultrasonic signal;
- a third module configured to generate a second ultrasonic signal;
- a mixer configured to generate a combined signal, said combined signal comprising:
  - an, either zero or non-zero, amount of said audio signal;
  - an, either zero or non-zero, amount of said ultrasonic signal; and,
  - an, either zero or non-zero, amount of said second ultrasonic signal;
- a transmitter configured to output an acoustic signal dependent upon the combined signal; and,
- a processing means for controlling:
  - the ultrasonic signal; and the second ultrasonic signal;

wherein, in response to receiving a fifth instruction for replacing the ultrasonic signal of a predetermined non-zero value with the second ultrasonic signal of a predetermined second value, in the combined signal, the processing means is configured to:
- decrease in the amount of the ultrasonic signal from the predetermined value to an essentially zero value, the decrease being executed over a predetermined disable time-period; and
- essentially simultaneously to initiating the decrease in the amount of said ultrasonic signal, initiating an increase in the amount of said second ultrasonic signal in the combined signal, said amount of said second ultrasonic signal being increased from an essentially zero value to the predetermined second value over a predetermined replace time-period, thereby at least substantially reducing the occurrence of pop noise in the acoustic signal due to the ultrasonic signal being replaced by the second ultrasonic signal.

The applicant has realized that such an overlap in the ramping down of the ultrasonic signal and ramping up said second ultrasonic signal can reduce the delay in starting the processing of the second ultrasonic signal. It can be beneficial, for example, in most ultrasonic touchless detection cases to resume the processing of said second ultrasonic signal as soon as possible after the removal of said ultrasonic signal. Accordingly, the shortest delay can be obtained by initiating the increase in the amount of said second ultrasonic signal essentially simultaneously to initiating the decrease in the amount of said ultrasonic signal. As an example, it will be appreciated that if the predetermined disable time-period is at least substantially equal to the predetermined replace time-period, by essentially completely overlapping the ramping down of the ultrasonic signal with the ramping up said second ultrasonic signal, essentially a whole time-period can be saved as compared to the case where the ramping up of said second ultrasonic signal follows the completion of the ramping down of the ultrasonic signal.

According to an aspect, the electronic device also comprises at least one receiver such as a microphone for receiving a response of the acoustic signal. In most cases, the response of the acoustic signal comprises an echo of the acoustic signal. The echo of the acoustic signal that is received by the receiver is a reflection of the acoustic signal reflected by an object that is present within a certain distance from the device. If multiple objects are present, the receiver may receive a plurality of echoes, each being reflected by each individual object. In some cases, the user may be considered an object, while in other cases a body part, such as a hand or a finger, of the user may be considered as an object. Accordingly, in such cases, different body parts, such as hands and head, of the user may be considered as different objects.

The echo may be processed using the processing means, or by another computer processor in the electronic device. When the combined signal comprises a non-zero amount of said ultrasonic signal, the processing means or the another processor is configured to analyze the echo for extracting one or more parameters related to the object. The parameters may include, distance of the object from the device, a movement parameter of the object such as speed or velocity of the object, trajectory or path of the object, and such. It will be appreciated that the processing operations mentioned previously, such as the processing of the second ultrasonic signal, can be performed by the processing means or processor. In some cases, the generation of the ultrasonic signal, and the audio signal is also controlled by the same processing means. Alternatively, the control may be done by different processing units functionally linked to each another. The processing units of the electronic device may be different units in terms of hardware, such as different integrated circuits, or they may be different software routines running on the same hardware processor.

According to an aspect, the processing means is a computer processor such as a microprocessor or digital signal processor ("DSP"). According to another aspect, at least one of: the first module, the second module, and the mixer, are a part of the processing means. According to another aspect, at least two of: the first module, the second module, and the mixer, are the same device. As mentioned, the mixer may be a part of the processing means, or it may be a different device functionally linked, in terms of hardware and/or software, to the processing means. Also, as mentioned, the first module and/or the second module may either be comprised within the processing means, or they may be different hardware and/or software modules functionally linked to the processing means.

One of more of the: processing means, first module, second module, third module may be implemented on a processing unit such as a DSP, or in a codec, or on an application processor ("AP"), or in a smart power amplifier ("smart PA"), or in a smart receiver. Alternatively, said modules may be distributed on a plurality of such processing units. It will be understood that a smart PA is an amplifier including one or more processing cores or processor(s). Similarly, a smart receiver is a general term for a smart microphone that also has one or more processing cores. Additionally, other modules as discussed in this disclosure may also be included on the same processing unit or distributed on multiple processing units as appropriate. For example, in case of a smart PA, the transmitter can also be a part of the same processing unit. An exact location of the modules or the processing means is not limiting to the scope or generality of the present teachings.

In some cases, at least one of the instructions or control signals may be generated by the processing means, for example, by other hardware or software modules within the processing means. In some cases, some of the instructions may be generated by another module or another processor functionally linked to the processing means.

Accordingly, summarizing the above, there can also be provided an electronic device comprising:
 a first module for generating an audio signal;
 a second module for generating an ultrasonic signal;
 a third module for generating a second ultrasonic signal;
 a mixer for generating a combined signal;
 a transmitter for outputting an acoustic signal dependent upon the combined signal;
 a receiver for receiving an echo of the combined signal being reflected by an object; and
 a processing means for:
  controlling the ultrasonic signal;
  controlling second ultrasonic signal; and
  analyzing the echo;
 wherein, in response to receiving a fifth instruction for replacing the ultrasonic signal of a predetermined value with the second ultrasonic signal of a predetermined second value, the processing means is configured to:
  interrupt analyzing the echo;
  initiate a decrease in the amount of the ultrasonic signal from the predetermined value to an essentially zero value, the decrease being executed over a predetermined disable time-period; and
  essentially simultaneously to initiating the decrease in the amount of said ultrasonic signal, initiating an increase in the amount of the second ultrasonic signal in the combined signal, said amount of said second ultrasonic signal being increased from an essentially zero value to the predetermined second value over a predetermined replace time-period; and
  resume analyzing the echo after the expiry of the replace time-period.

As was discussed previously, the time-periods are such that the occurrence of pop noise in the acoustic signal is reduced at least substantially. The time-periods and modules can be similar to those as discussed in the disclosure.

So, there can also be provided an electronic device comprising:
 a first module for generating an audio signal;
 a second module configured to generate an ultrasonic signal;
 a third module configured to generate a second ultrasonic signal;
 a mixer configured to generate a combined signal, said combined signal comprising:
  an, either zero or non-zero, amount of said audio signal;
  an, either zero or non-zero, amount of said ultrasonic signal; and,
  an, either zero or non-zero, amount of said second ultrasonic signal;
 a transmitter configured to output an acoustic signal dependent upon the combined signal;
 a receiver configured to receive an echo of the combined signal being reflected by an object; and
 a processing means for:
  controlling the ultrasonic signal;
  controlling the second ultrasonic signal; and analyzing the echo for determining at least one parameter related to the object;
wherein, in response to receiving a fifth instruction for replacing the ultrasonic signal of a predetermined non-zero value with the second ultrasonic signal of a predetermined second value, in the combined signal, the processing means is configured to:
  interrupt analyzing the echo;
  initiate a decrease in the amount of the ultrasonic signal from the predetermined value to an essentially zero value, the decrease being executed over a predetermined disable time-period; and
  essentially simultaneously to initiating the decrease in the amount of said ultrasonic signal, initiating an increase in the amount of the second ultrasonic signal in the combined signal, said amount of said second ultrasonic signal being increased from an essentially zero value to the predetermined second value over a predetermined replace time-period, thereby at least substantially reducing the occurrence of pop noise in the acoustic signal due to the ultrasonic signal being replaced by the second ultrasonic signal; and
  resume analyzing the echo after the expiry of the replace time-period.

Accordingly, corresponding to the first perspective, there can also be provided a method for reducing the occurrence of pop noise in an acoustic signal generated by a transmitter in an electronic device, the electronic device also comprising a first module, a second module, a mixer, and a processing means, which method comprises:
  generating a combined signal using the mixer; the combined signal being generated dependent upon:
    an ultrasonic signal from the second module; and
    an audio signal from the first module;
  generating, using the transmitter, the acoustic signal dependent upon the combined signal;
  receiving, at the processing means, a first instruction signal for initiating the ultrasonic signal in the combined signal;
  initiating, in response to the first instruction signal, via the processing means an increase in the amount of said ultrasonic signal in the combined signal, wherein
  the amount of the ultrasonic signal in the combined signal is increased from an essentially zero value to the predetermined value over a predetermined enable time-period.

As it was discussed, the combined signal in such case may comprise either a non-zero, amount of an audio signal, or it may not comprise the audio signal (or a zero amount of audio signal). However, the combined signal does not comprise the ultrasonic signal when the first instruction occurs, i.e., the ultrasonic signal is absent from the combined signal. The ultrasonic signal may be absent from the combined signal, e.g., by the transmission from the ultrasonic output being disabled, or it may be blocked by the mixer, as it was discussed previously.

As also discussed previously, the time-period is selected such that the occurrence of pop noise in the acoustic signal due to the ultrasonic signal being initiated is reduced at least substantially. The range and value of the enable time-period can be as was discussed previously.

Similarly, corresponding to the second perspective, there can also be provided a method for reducing the occurrence of pop noise in an acoustic signal generated by a transmitter in an electronic device, the electronic device also comprising a first module, a second module, a mixer, and a processing means, which method comprises:
  generating a combined signal using the mixer; the combined signal being generated dependent upon:
    an ultrasonic signal from the second module; and
    an audio signal from the first module;
  generating, using the transmitter, the acoustic signal dependent upon the combined signal;
  receiving, at the processing means, a second instruction signal for terminating the ultrasonic signal from the combined signal;
  initiating, in response to the second instruction signal, via the processing means a decrease in the amount of said ultrasonic signal in the combined signal, wherein
  the amount of the ultrasonic signal is decreased from the predetermined value to an essentially zero value over a predetermined disable time-period.

As was discussed previously, the combined signal in such case may comprise either a non-zero, amount of an audio signal, or it may not comprise the audio signal (or a zero amount of audio signal). However, the combined signal comprises the ultrasonic signal when the second instruction occurs, i.e., the predetermined amount of ultrasonic signal is present in the combined signal.

Similarly, corresponding to the third perspective, there can also be provided a method for reducing the occurrence of pop noise in an acoustic signal generated by a transmitter in an electronic device, the electronic device also comprising a first module, a second module, a mixer, and a processing means, which method comprises:
  generating a combined signal using the mixer; the combined signal being generated dependent upon:
    an ultrasonic signal from the second module; and
    an audio signal from the first module:
  generating, using the transmitter, the acoustic signal dependent upon the combined signal;
  receiving, at the processing means, a third instruction signal for terminating the audio signal in the combined signal;
  initiating, in response to the third instruction signal, via the processing means a decrease in the amount of said ultrasonic signal in the combined signal, wherein
  the amount of the ultrasonic signal is decreased from a predetermined value to an essentially zero value over a predetermined disable time-period; and
  terminating or removing, upon expiry of the predetermined disable time-period, the audio signal from the combined signal.

Similar as for the electronic device, in cases where is required to resume the ultrasonic transmission after ramping down the amount of said ultrasonic signal in response to the third instruction for interrupting the audio signal, the method further comprises:
  receiving, at the processing means, a fourth instruction signal for resuming the transmission of the ultrasonic signal in the combined signal;
  initiating, in response to the fourth instruction signal, an increase in the amount of said ultrasonic signal in the combined signal, wherein
  the amount of the ultrasonic signal is increased from an essentially zero value to a predetermined value over a predetermined re-enable time-period.

Similarly, corresponding to the fourth perspective, for replacing the ultrasonic signal by a second ultrasonic signal, there can be provided a method for reducing the occurrence of pop noise in an acoustic signal generated by a transmitter in an electronic device, the electronic device also comprising a first module, a second module, a third module, a mixer, and a processing means, which method comprises:

generating a combined signal using the mixer; the combined signal being generated dependent upon:
an ultrasonic signal from the second module;
an audio signal from the first module; and
a second ultrasonic signal from the third module;
generating, using the transmitter, the acoustic signal dependent upon the combined signal;
receiving, at the processing means, a fifth instruction for replacing the ultrasonic signal with a second ultrasonic signal in the combined signal;
initiating, in response to the fifth instruction, via the processing unit a decrease in the amount of the ultrasonic signal in the combined signal, wherein
the amount of the ultrasonic signal is decreased from a predetermined value to an essentially zero value over a predetermined disable time-period; and
initiating, essentially simultaneously to initiating the decrease in the amount of the ultrasonic signal, an increase in the amount of the second ultrasonic signal in the combined signal via the second ultrasonic output, wherein
the amount of the second ultrasonic signal is increased from an essentially zero value to a predetermined second value over a predetermined replace time-period.

The transmitter and the receiver may be separate devices, such as a speaker and a microphone, or they may even be the same device configured to operate as transmitter and receiver at different times. For example, a transducer may be configured to operate as a transmitter for transmitting an ultrasonic signal in a transmit mode, and the same transducer may be configured to operate as a receiver for receiving a reflection or echo of the ultrasonic signal in a receive mode. In some cases, the electronic device may comprise a plurality of transmitters and/or receivers. The plurality may comprise non-equal number of transmitters and receivers, for example, the device in certain cases comprise two transmitters and one receivers. The number of transmitters and/or receivers is non-limiting to the scope or generality of this disclosure.

The plurality of transmitters and/or a plurality of receivers may be used to generate multiple transmitter-receiver combinations for ultrasonic processing. Multiple transmitter-receiver combinations may be used to extract spatial information related to the object and/or surroundings.

As previously discussed, the processing means is a computer or data processor such as a microprocessor or microcontroller, DSP, application specific integrated circuit ("ASIC"), FPGA or any such device. The processing unit may be a combination of different hardware components or modules. In some cases, the processing means may essentially be a sub-routine running on a processor. In some cases, the processing means may also include a machine learning module for improving the accuracy of ultrasonic processing over use cases of the electronic device. The processing unit may further include an artificial intelligence ("AI") module.

The electronic device may be any device, mobile or stationary. Accordingly, devices such as mobile phones, tablets, voice assistants, smart speakers, notebook computers, desktop computers, soundbars, home theater units, fitness trackers, smartwatches and similar devices fall within the ambit of the term electronic device. More generally, any devices that comprise audio components that are configured for ultrasonic transmission fall within the ambit of the term.

The processing of the echo signal may be based on time of flight ("TOF") measurements between the transmitted ultrasonic signal and the corresponding echo. The processing of the echo signals may also be based on the amplitude of the measured signal, or phase difference between the transmitted signal and the measured signal, or the frequency difference between the transmitted signal and the measured signal, or a combination thereof. The transmitted ultrasonic signal may comprise either a single frequency or a plurality of frequencies. In another embodiment, the transmitted ultrasonic signal may comprise chirps.

Viewed from yet another perspective, the present teachings can also provide a computer software product for implementing any method steps disclosed herein when run on the processing means or a suitable processor. Accordingly, the present teachings also relate to a computer readable program code having specific capabilities for executing any method steps herein disclosed. In other words, the present teachings relate also to a computer readable medium, such as a non-transitory medium, storing a program causing the electronic device to execute any method steps herein disclosed.

For example, corresponding to the first perspective, there can also be provided a computer software product comprising instructions that, when executed by a suitable processing means or processor, cause the processing means to:
control generation of a combined signal using a mixer; the combined signal being generated dependent upon:
an ultrasonic signal from a second module; and
an audio signal from a first module;
control, using a transmitter, generation of an acoustic signal dependent upon the combined signal;
receive a first instruction signal for initiating the ultrasonic signal in the combined signal;
initiate, in response to the first instruction signal, an increase in the amount of said ultrasonic signal in the combined signal, wherein
the amount of the ultrasonic signal in the combined signal is increased from an essentially zero value to the predetermined value over a predetermined enable time-period.

Similarly, corresponding to the second perspective, there can also be provided a computer software product comprising instructions that, when executed by a suitable processing means, cause the processing means to:
control generation a combined signal using the mixer; the combined signal being generated being dependent upon:
an ultrasonic signal from a second module; and
an audio signal from a first module;
control, using a transmitter, generation of an acoustic signal dependent upon the combined signal;
receive a second instruction signal for terminating the ultrasonic signal in the combined signal;
initiate, in response to the second instruction signal, a decrease in the amount of said ultrasonic signal in the combined signal, wherein
the amount of the ultrasonic signal in the combined signal is decreased from the predetermined value to an essentially zero value over a predetermined disable time-period.

Similarly, corresponding to the third perspective, there can also be provided a computer software product comprising instructions that, when executed by a suitable processing means, cause the processing means to:
control generation of a combined signal using a mixer; the combined signal being generated dependent upon:
an ultrasonic signal from a second module; and
an audio signal from a first module;
control, using a transmitter, generation of an acoustic signal dependent upon the combined signal;

receive a third instruction signal for terminating the audio signal in the combined signal;

initiate, in response to the third instruction signal, a decrease in the amount of said ultrasonic signal in the combined signal, wherein the amount of the ultrasonic signal is decreased from the predetermined value to an essentially zero value over a predetermined disable time-period; and terminate or remove, upon expiry of the predetermined disable time-period, the audio signal in the combined signal.

Similarly, for resuming the ultrasonic transmission after ramping down the amount of said ultrasonic signal in response to the third instruction for interrupting the audio signal, the processing means is further caused to:

receive a fourth instruction signal for resuming the transmission of the ultrasonic signal in the combined signal;

initiate, in response to the fourth instruction signal, an increase in the amount of said ultrasonic signal in the combined signal, wherein the amount of the ultrasonic signal is increased from an essentially zero value to a predetermined value over a predetermined re-enable time-period.

Similarly, corresponding to the fourth perspective, for replacing the ultrasonic signal by a second ultrasonic signal, there can also be provided a computer software product comprising instructions that, when executed by a suitable processing means, cause the processing means to:

control generation of a combined signal using the mixer; the combined signal being generated dependent upon:
an ultrasonic signal from a second module;
an audio signal from a first module; and
a second ultrasonic signal from a third module;

control, using a transmitter, generation of an acoustic signal dependent upon the combined signal;

receive a fifth instruction for replacing the ultrasonic signal with a second ultrasonic signal in the combined signal;

initiate, in response to the fifth instruction, a decrease in the amount of the ultrasonic signal in the combined signal, wherein the amount of the ultrasonic signal is decreased from a predetermined value to an essentially zero value over a predetermined disable time-period; and initiate, essentially simultaneously to initiating the decrease in the amount of the ultrasonic signal, an increase in the amount of the second ultrasonic signal in the combined signal, wherein the amount of the second ultrasonic signal is increased from an essentially zero value to a predetermined second value over a predetermined replace time-period.

Example embodiments are described hereinafter with reference to the accompanying drawings. Drawings may not necessarily be drawn to scale, without that affecting the scope of generality of the present teachings.

DETAILED DESCRIPTION

Figure 1:
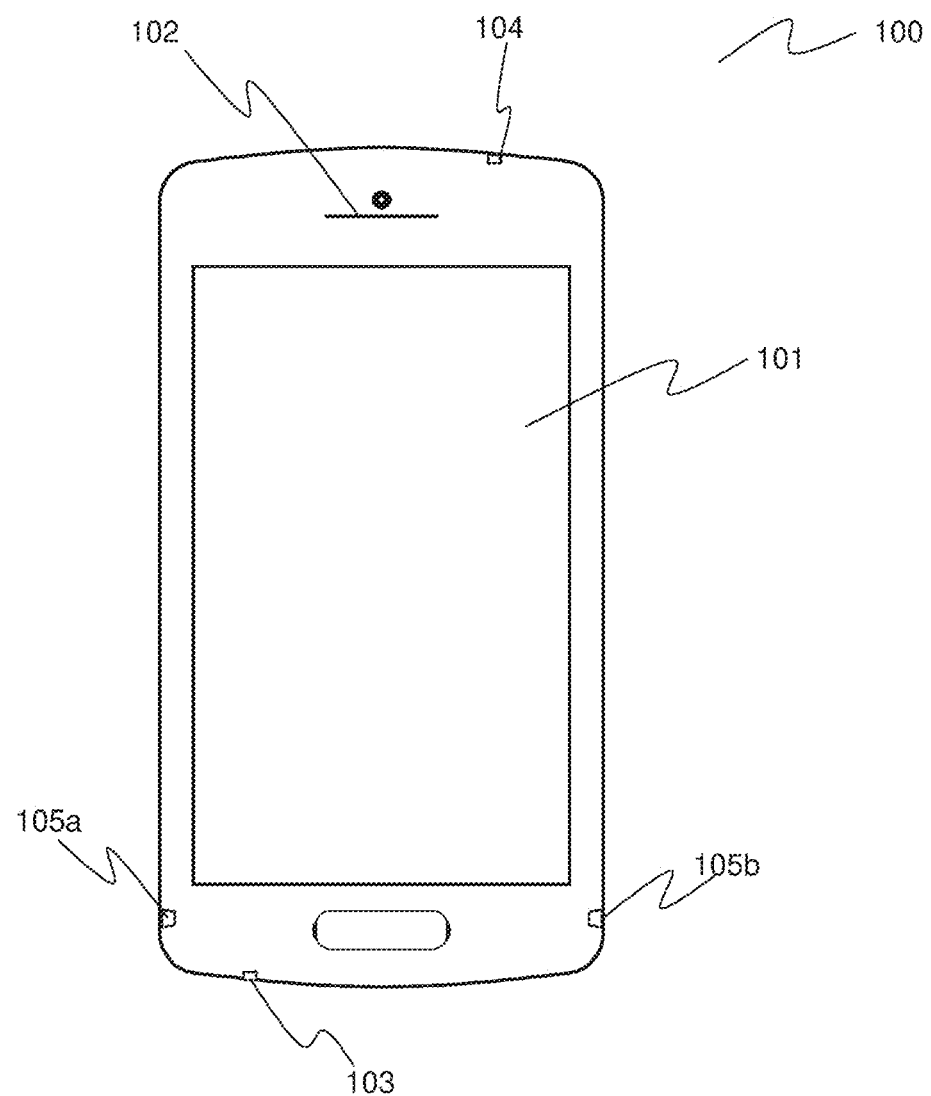
FIG. 1 shows an electronic device as a smartphone

FIG. 1 shows an example of the electronic device 100. The electronic device 100 is shown as a mobile phone or a smartphone comprising a screen 101 for touch-based interaction with the phone 100. The phone 100 comprises an earpiece speaker 102 that can also be used as an ultrasonic transmitter, and a microphone 103 that can also be used as an ultrasonic receiver. The usual function of the earpiece speaker 102 is to generate an audible acoustic signal. The audible acoustic signal can for example, be an audio file played by the user of the phone 100, a voice of the caller to the phone 100, or even a ringtone. When the speaker 102 is used for ultrasonic touchless interaction, the speaker 102 is used to generate an acoustic signal that comprises an ultrasonic component or ultrasound. The acoustic signal in that case may or may not comprise an audio component. It will depend upon the state or use case of the phone 100, for example, whether an audio file is played through the speaker 102, or if the phone 100 is ringing or is in a call while the ultrasonic signal is being generated. In such cases, when an audio signal is present, a combined signal generated by a mixer in the phone 100 will have both a non-zero audio signal and a non-zero ultrasonic signal. The speaker 100 generating an acoustic signal dependent on the combined signal will thus have both an audio component and an ultrasonic component. Accordingly, the device 100 comprises a first module for generating the audio signal, and a second module for generating the ultrasonic signal. The mixer is used to generate the combined signal that may comprise either or both of: the audio signal, and the ultrasonic signal. The combined signal is then used for generating the acoustic signal through the speaker 102. In other words, the combined signal may be generated by the mixer by using signals at an audio output and at an ultrasonic output. Said outputs may either be a respective part of the first module and the second module, or they may be a part of the mixer itself. It will be understood that the combined signal may be generated by selecting appropriately, one or both of the audio signal and the ultrasonic signal either at their respective modules or from within the mixer. The phone 100 further comprises a processing means in the form of a computer processor.

Optionally, the phone 100 may also comprise a plurality of transmitters and/or receivers. The plurality of transmitters may be equal or unequal to the plurality of receivers. In the phone 100 shown as an example, another microphone 104 is shown on the top side of the phone 100. Also, a pair 105 of stereophonic speakers 105a and 105b are shown. It is also possible that at least one of the transmitters and receivers is an acoustic transducer, i.e., the transducer is capable of working both as a transmitter and a receiver at different times.

Figure 2:
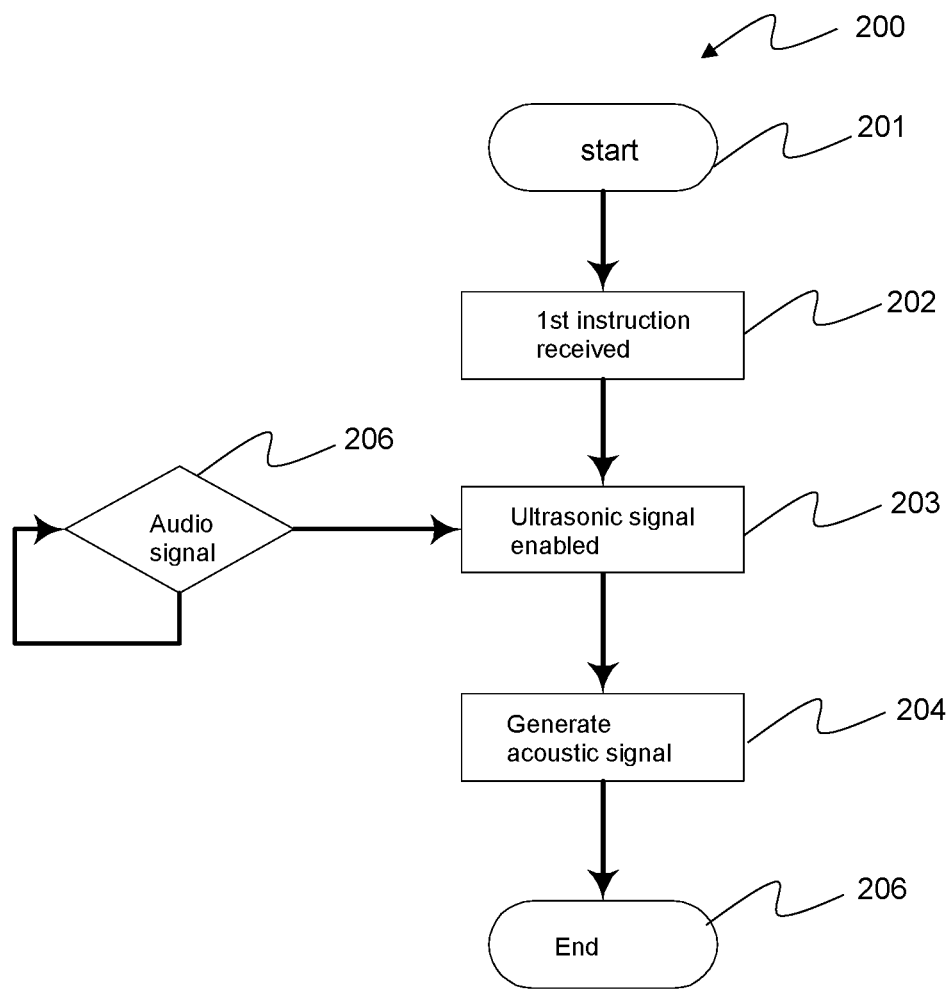
FIG. 2 shows a flow-chart for enabling the ultrasonic signal

FIG. 2 shows a flow-chart 200 representing an implementation of the first perspective, i.e., the case when an ultrasonic transmission is to be initiated from the receiver 102. At start 201 of the method, in step 202, a first instruction for initiating the generation of the ultrasonic signal is received by the processing means. By generation, here it is meant that first instruction relates to an inclusion of the ultrasonic signal in the combined signal. By saying initiating, it will be clear that the ultrasonic signal is absent from the combined signal prior to the first instruction. It will further be appreciated that the combined signal may itself be absent provided the audio signal is not present either. If audio signal is absent, the combined signal may need to be generated based on the ultrasonic signal alone. In either case, i.e., the audio signal being present or not, an inclusion or initiation of the ultrasonic signal in the combined signal may cause pop- or click-noise in the acoustic signal. To alleviate this, in step 203, the ultrasonic signal is enabled in the combined signal along with an application of a function. Accordingly, the value of the ultrasonic signal in the combined signal is gradually increased, from an essentially zero value to a predetermined value or desired value, over a predetermined enable time-period. In step 204, the combined signal is used to generate the acoustic signal via the transmitter 102. The function may be a ramp function or any other function that increases the ultrasonic signal gradually within the predetermined enabled time-period, such that the pop- or click-noise in the acoustic signal is at least substantially reduced due to the initiation of the ultrasonic signal. In the end 205, the combined signal comprises the predetermined amount of the ultrasonic signal. The process may either end at 205, or it may be followed by another routine. An optional step 206 is also shown, which checks whether the audio signal is present. If the audio signal is present, in step 203, the combined signal is generated either with or without the ultrasonic signal dependent upon whether the first instruction is received or not. If the first instruction is not received, in step 203, the combined signal will be generated based on the audio signal, and without the ultrasonic signal. As it was discussed previously, the amount of signal may refer to any parameter such as: amplitude, power or p-p value of the respective signal, either instantaneous or averaged over a given time or cycles.

Figure 3:
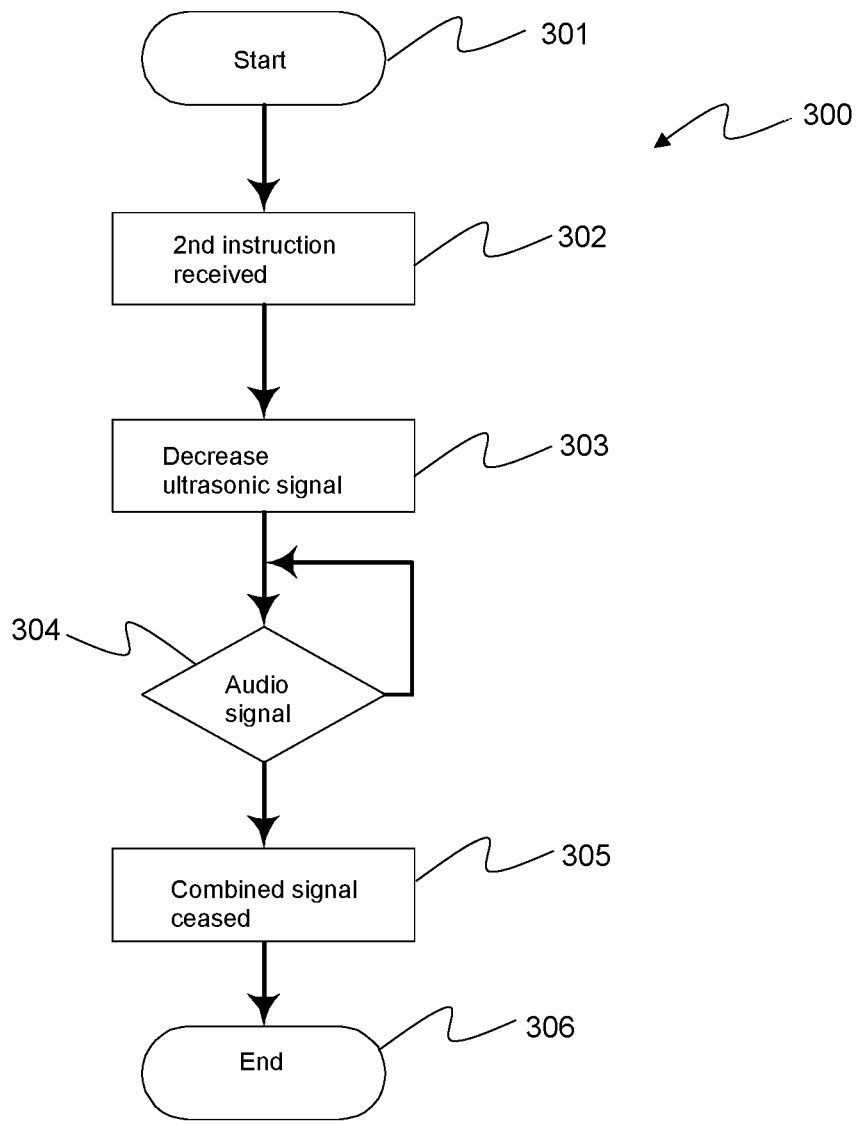
FIG. 3 shows a flow-chart for disabling the ultrasonic signal

FIG. 3 shows a flow-chart 300 representing an implementation of the second perspective, i.e., the case when an ultrasonic transmission is to be terminated from the receiver 102. At the start 301 of the method, the combined signal comprises a predetermined amount of ultrasonic signal. It will be appreciated that in practice, the start 301 may following the step 205. In step 302, a second instruction for terminating the generation of the ultrasonic signal is received. It will be clear that in this case, that in the start the combined signal comprises a non-zero amount of the ultrasonic signal. By termination, it will be understood that it is desired to essentially remove the ultrasonic signal from the combined signal. In response to the second instruction, in step 303, the processing means proceeds to decrease the amount of the ultrasonic signal from the predetermined value to an essentially zero value to over a predetermined disable time-period. The decrease may be initiated by applying of a function to the ultrasonic signal. The function may be similar, but inverse of the type of function as discussed in context of FIG. 2. In this case, for example, the function may be a downward ramp or a ramp with a decreasing slope. An optional step 304 is also shown which represents if the audio signal is present in the combined signal. If the audio signal is present, upon the expiry of the predetermined disable time-period, the combined signal comprises the audio signal, but not the ultrasonic signal. If, however, the audio signal is absent or is disabled, in step 305 the combined signal may also be ceased, and the process ended 306.

Figure 4:
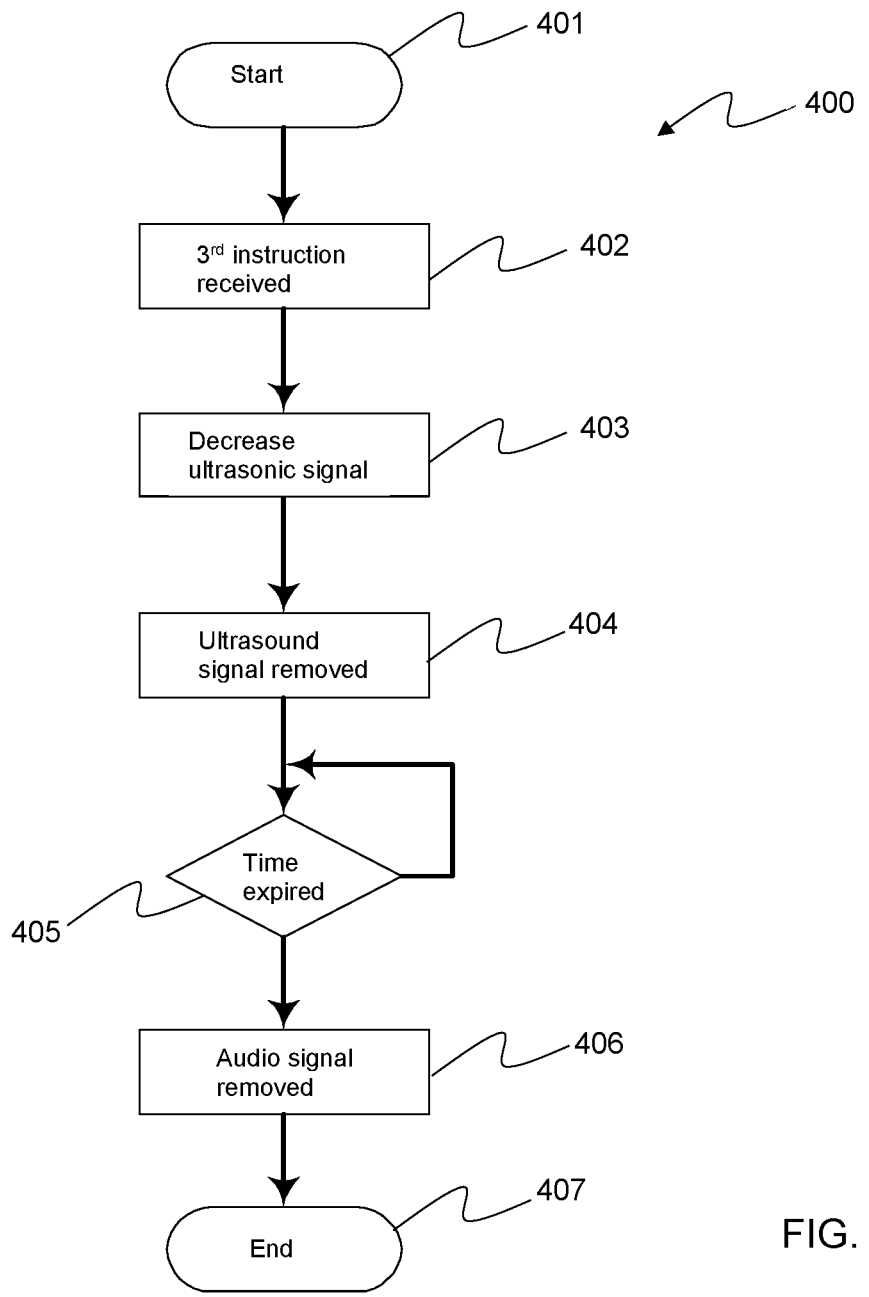
FIG. 4 shown a flow-chart for disabling the audio signal from the combined signal comprising non-zero ultrasonic signal

FIG. 4 shows a flow-chart 400 representing an implementation of the third perspective, i.e., the case when terminating the audio signal from the combined signal. At the start 401 of the method, which also in this case may be following the step 205, the combined signal comprises non-zero amounts of both the audio signal and the ultrasonic signal. The amount of the ultrasonic signal at start is at a predetermined value. In step 402, a third instruction is received by the processing means for terminating or removing the audio signal from the combined signal. In response to the third instruction, in step 403, the processing means initiates a decrease in the amount of the ultrasonic signal in the combined signal. It may be recognized for example that flowchart 300 may be applied here for implementing the decrease. The ultrasonic signal is thus decreased from the predetermined value to an essentially zero value over the predetermined disable time-period. The combined signal thus eventually 404 is removed of the ultrasonic signal. In step 405, which is shown separately just for explanation, it is shown that it is checked if the predetermined disable time-period has expired. When the predetermined disable time-period is expired, i.e., the ultrasonic signal is removed from the combined signal, in step 406, the audio signal is also removed from the combined signal, and the process may end 407. It will be appreciated that if it desired, after the removal of the audio signal, to resume the ultrasonic transmission, the method similar to the first perspective or flow chart 200 may be applied for resuming the ultrasonic signal.

Figure 5:
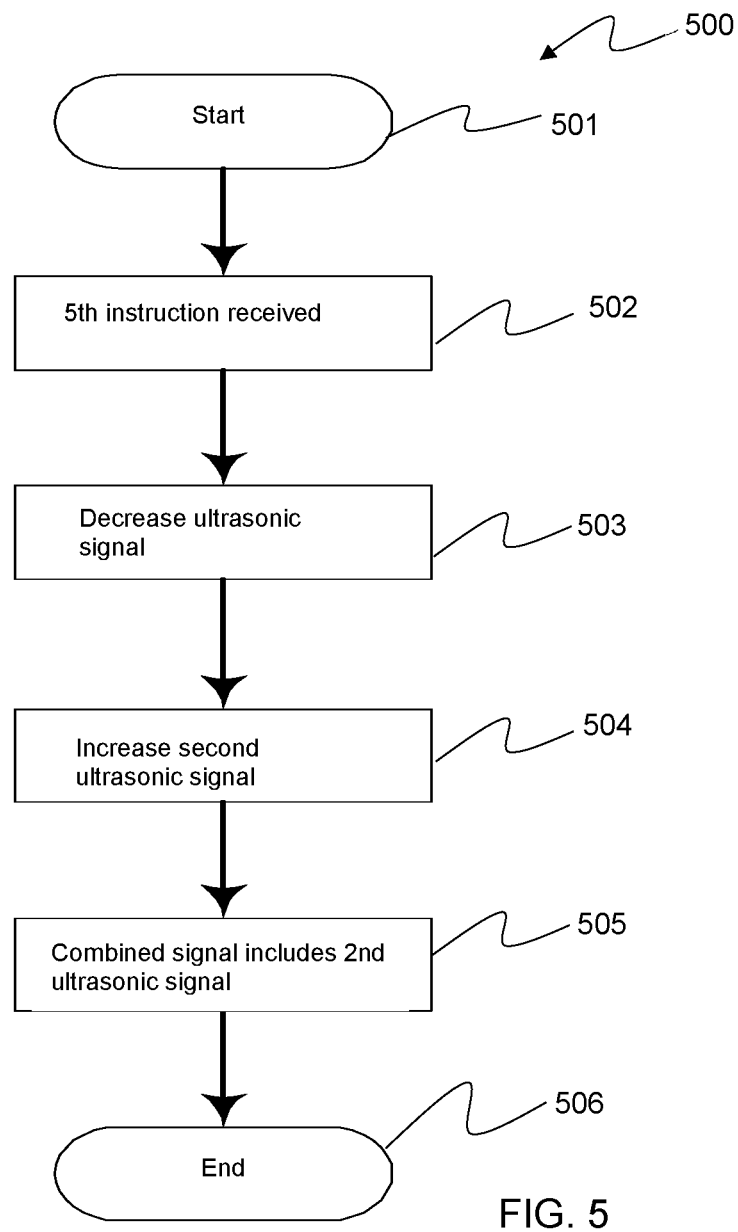
FIG. 5 shows a flow-chart for replacing the ultrasonic signal

FIG. 5 shows a flow-chart 500 representing an implementation of the fourth perspective, i.e., the case when replacing the ultrasonic signal, by a second ultrasonic signal, in the combined signal, or changing the gain of the ultrasonic signal. At the start 501 of the method, the combined signal comprises a predetermined value of the ultrasonic signal. The audio signal may or may not be present in the combined signal. Here also, the start may represent a state similar to the step 205 with ultrasonic signal present. In step 502 a fifth instruction is received by the processing means for replacing the ultrasonic signal a second ultrasonic signal of a predetermined second value. In step 503, the processing means then proceeds to decrease the amount of the ultrasonic signal from the predetermined value to an essentially zero value over a predetermined disable time-period. Although shown after the step 503, in step 504, the processing means essentially simultaneously to initiating the decrease in the ultrasonic signal, also starts to increase the amount of the second ultrasonic signal in the combined signal from an essentially zero value to a predetermined second value. The second ultrasonic signal is thus increased from essentially zero value to the predetermined second value over a predetermined replace time-period. The predetermined disable time-period may be equal or unequal to the predetermined replace time-period. At the expiry of the predetermined replace time-period and the predetermined disable time-period, in step 505, the combined signal thus comprises the second ultrasonic signal, while the ultrasonic signal is removed from the combined signal. The process may thus end 506, where for example, the ultrasonic touchless interaction sensing may be resumed based on the second ultrasonic signal. The sensing may have been suspended at or before the start of the decrease. Processing time may thus be saved and a quicker replacement of the transmit signal may be achieved.

Figure 6:
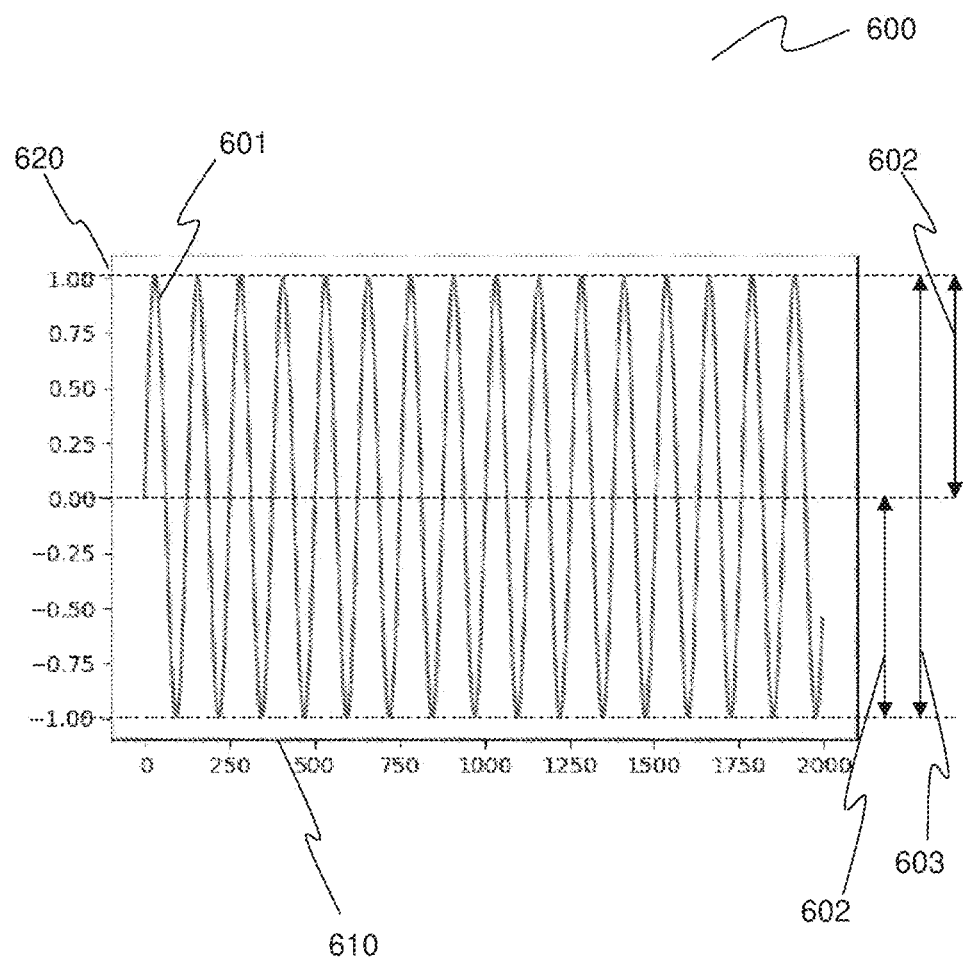
FIG. 6 shows a plot of an ultrasonic signal with a constant amplitude

FIG. 6 shows a plot 600 of a portion of an ultrasonic signal 601 that has a given amplitude value 602 and peak-to-peak ("p-p") value 603. The numbers on the X-axis 610 and Y-axis 620 are for illustration only, but the X-axis represents time and the Y-axis represents a normalized amplitude. If such a signal 601 is applied to and/or removed from audio components, i.e., by including and/or terminating it in the combined signal, pop- or click-noise may occur in the acoustic signal, which is not desirable.

Figure 7:
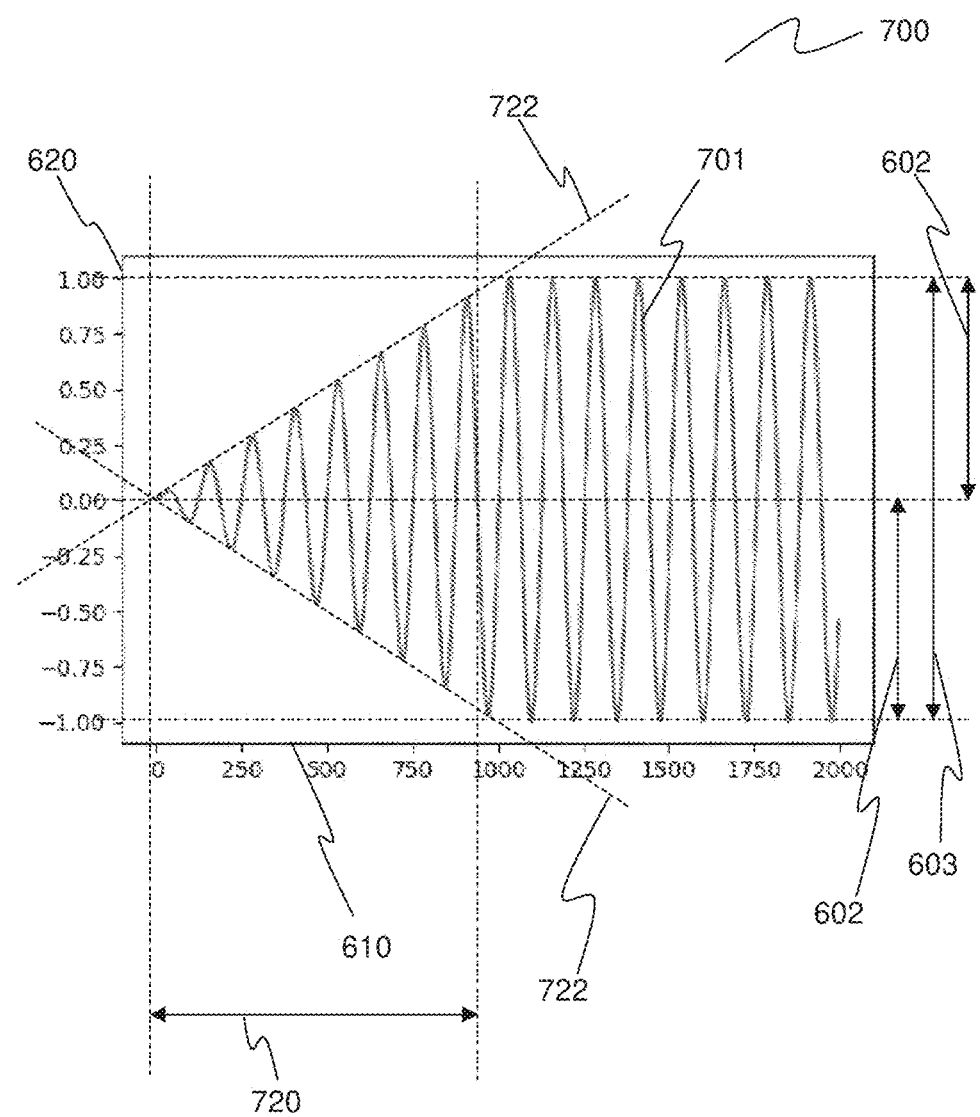
FIG. 7 shows a plot of an ultrasonic signal with an enable time-period

FIG. 7 shows a plot 700 of at least an initial portion of an ultrasonic signal 701 pursuant to the present teachings. When initiating the ultrasonic signal 701, for example, in response to the first instruction, the amount of signal 701 is increased over the predetermined enable time-period 720. In this case the increase is shown implemented using a ramp 722. As it will be appreciated, this may be achieved for example by applying a ramp function to the signal 601 at its start. Subsequent to the expiry of the predetermined enable time-period 720, the initiated signal 701 can be identical to the signal 601, thus both signals may have similar amplitude 602, and here also p-p value 603. As it will be obvious, the ultrasonic signal 701 being an electrical signal may be represented as a voltage, current, or even power. The amount of signal may be specified as an amplitude value, p-p value or such. As can be seen in FIG. 7, the amplitude value of the signal 701 is increased from essentially a zero value to a predetermined value 602 over the time-period 720 of the ramp. Similarly, it may here also be said that the p-p value of the signal 701 is increased from essentially a zero value to a predetermined value 603 over the time-period 720 of the ramp.

Figure 8:
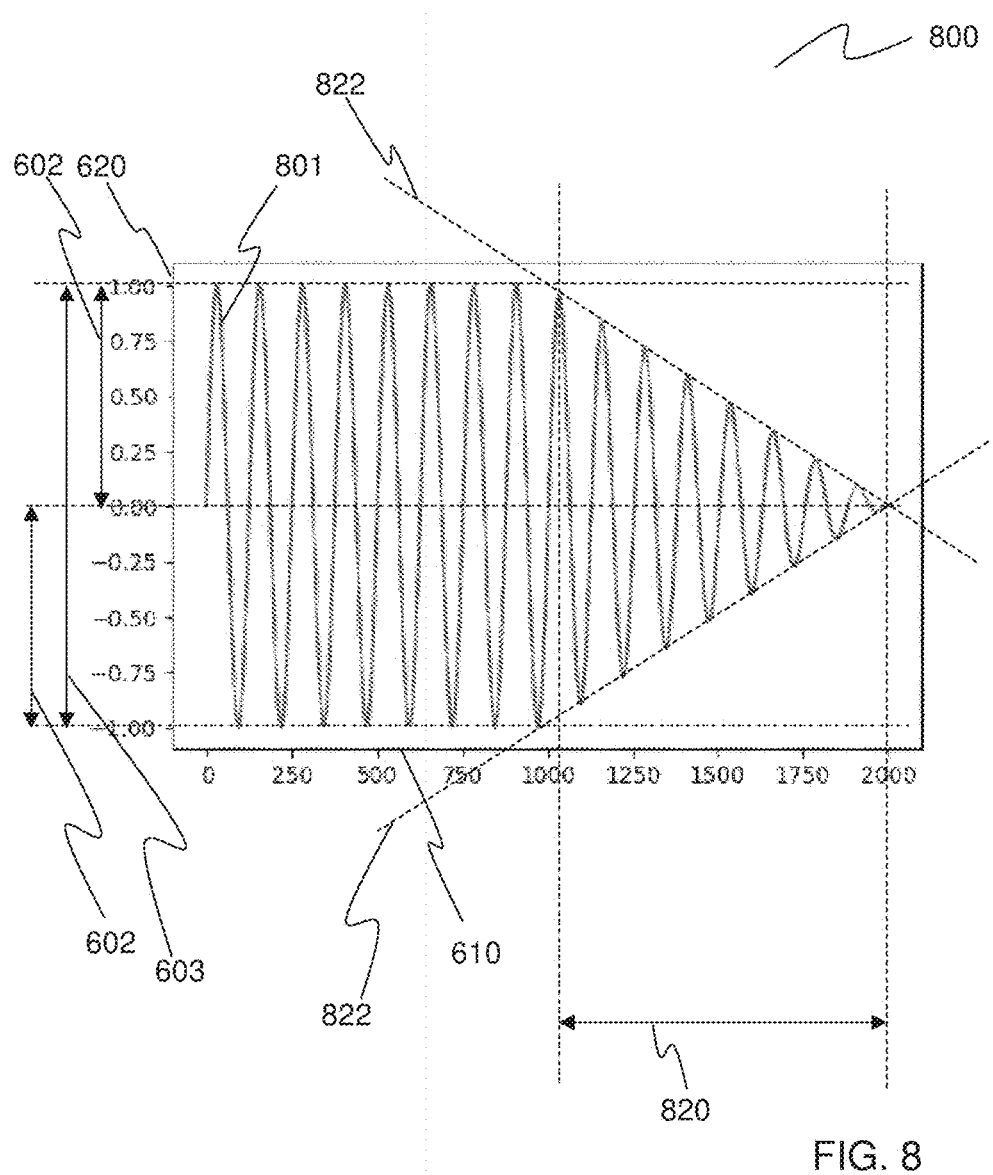
FIG. 8 shows a plot of an ultrasonic signal with a disable time-period

FIG. 7 shows another plot 800 of a final portion of an ultrasonic signal 801 being terminated pursuant to the present teachings. When terminating the ultrasonic signal 801, for example, in response to the second instruction, the amount of signal 801 is decreased over the predetermined disable time-period 820. In this case the decrease is shown implemented using a ramp 822. As it will be appreciated, this may be achieved for example by applying a ramp function to the signal 601 towards its end. Prior to the start of the predetermined disable time-period 820, the terminated signal 801 can be identical to the signal 601, thus both signals may have similar amplitude 602, and here also p-p value 603. As it will be obvious, the ultrasonic signal 801 being an electrical signal may be represented as a voltage, current, or even power. The amount of signal may be specified as an amplitude value, p-p value or such. As can be seen in FIG. 8, the amplitude value of the signal 801 is decreased from essentially a predetermined value 602 to an essentially zero value over the time-period 820 of the ramp 822. Similarly, it may here also be said that the p-p value of the signal 801 is decreased from essentially a predetermined value 603 to essentially a zero value over the time-period 820 of the ramp 822.

Various embodiments have been described above for a method for reducing the occurrence of pop noise in an acoustic signal generated by a transmitter in an electronic device, a software product implementing such methods, and for an electronic device configured to execute such a software product. Those skilled in the art will understand, however that changes and modifications may be made to those examples without departing from the spirit and scope of the following claims and their equivalents. It will further be appreciated that aspects and features from any of the method and product embodiments discussed herein may be freely combined.

Thus, to summarize, the present teachings can provide an electronic device comprising: a first module for generating an audio signal; a second module configured to generate an ultrasonic signal; a mixer for generating a combined signal; a transmitter configured to output an acoustic signal dependent upon the combined signal; and, a processing means for controlling the ultrasonic signal; wherein, in response to receiving a first instruction signal for initiating the ultrasonic signal, the processing means is configured to increase the amount of the ultrasonic signal in the combined signal from an essentially zero value to a predetermined value over a predetermined enable time-period. The present teachings also relate to an electronic device configured to decrease the amount of the ultrasonic signal in the combined signal from an essentially zero value to a predetermined value over a predetermined disable time-period, and to an electronic device configured to remove the audio signal from the combined signal whilst preventing pop-noise, and to an electronic device capable of replacing the ultrasonic signal whilst minimizing the processing time. The present teachings further relate to a method for reducing the occurrence of pop noise in an acoustic signal associated with: initiating the ultrasonic signal in the combined signal, terminating the ultrasonic signal in the combined signal, terminating the audio signal in the combined signal, and replacing the ultrasonic signal in the combined signal. The present teachings also relate to a computer software product for implementing any of the method steps disclosed herein, and to a computer storage medium storing the computer software herein disclosed.

Certain embodiments of the present teachings are now summarized in the following clauses.

Clause 1.

An electronic device comprising:
a first module for generating an audio signal;
a second module for generating an ultrasonic signal;
a mixer for generating a combined signal;
a transmitter for outputting an acoustic signal dependent upon the combined signal; and,
a processing means for controlling the ultrasonic signal; wherein, in response to receiving a first instruction signal for initiating the ultrasonic signal, the processing means is configured to increase the amount of the ultrasonic signal in the combined signal from an essentially zero value to a predetermined value over a predetermined enable time-period.

Clause 2.

Electronic device according to clause 1, wherein in response to receiving a second instruction signal for terminating the ultrasonic signal, the processing means is configured to decrease the amount of the ultrasonic signal in the combined signal from the predetermined value to an essentially zero value over a predetermined disable time-period.

Clause 3.

Electronic device according to clause 1, wherein, in response to receiving a third instruction signal for terminating the audio signal, the processing means is configured to:
  decrease the amount of the ultrasonic signal, in the combined signal, from a predetermined value to an essentially zero value over a predetermined disable time-period; and
upon expiry of the predetermined disable time-period, terminate or remove the audio signal from the combined signal.

Clause 4.

Electronic device according to clause 3, wherein in response to receiving a fourth instruction signal for resuming generation of the ultrasonic signal in the combined signal, the processing means is further configured to:
  increase the amount of said ultrasonic signal from an essentially zero value to the predetermined value over a re-enable time-period.

Clause 5.

Electronic device according to clause 1, wherein the electronic device further comprises a third module for generating a second ultrasonic signal and, wherein, in response to receiving a fifth instruction signal for replacing the ultrasonic signal, the processing means is configured to:
- initiate a decrease in the amount of the ultrasonic signal in the combined signal from the predetermined value to an essentially zero value, the decrease being executed over a predetermined disable time-period; and
- essentially simultaneously to initiating the decrease in the amount of said ultrasonic signal, initiate an increase in the amount of said second ultrasonic signal in the combined signal, said amount of said second ultrasonic signal being increased from an essentially zero value to a predetermined second value over a predetermined replace time-period.

Clause 6.

Electronic device according to clause 5, wherein the electronic device also comprises a receiver for receiving an echo of the combined signal being reflected by an object, and the processing means is configured to analyze the echo, and wherein the processing means is configured to:
- interrupt analyzing the echo prior to initiating the decrease in the amount of the ultrasonic signal; and
- resume analyzing the echo after the expiry of the replace time-period.

Clause 7.

An electronic device comprising:
- a first module for generating an audio signal;
- a second module for generating an ultrasonic signal;
- a mixer for generating a combined signal;
- a transmitter for outputting an acoustic signal dependent upon the combined signal; and,
- a processing means for controlling the ultrasonic signal;

wherein, in response to receiving a second instruction signal for terminating the ultrasonic signal, the processing means is configured to decrease the amount of the ultrasonic signal in the combined signal from a predetermined value to an essentially zero value to over a predetermined disable time-period.

Clause 8.

An electronic device comprising:
- a first module for generating an audio signal;
- a second module for generating an ultrasonic signal;
- a mixer for generating a combined signal;
- a transmitter for outputting an acoustic signal dependent upon the combined signal; and,
- a processing means for controlling the ultrasonic signal;

wherein, in response to receiving a first instruction signal for initiating the ultrasonic signal, the processing means is configured to:
- increase the amount of the ultrasonic signal in the combined signal from an essentially zero value to a predetermined enable value over a predetermined enable time-period; and in response to receiving a second instruction signal for terminating the ultrasonic signal, the processing means is configured to:
- decrease the amount of the ultrasonic signal from a predetermined disable value to an essentially zero value over a predetermined disable time-period.

Clause 9.

An electronic device comprising:
- a first module for generating an audio signal;
- a second module for generating an ultrasonic signal;
- a mixer for generating a combined signal;
- a transmitter for outputting an acoustic signal dependent upon the combined signal; and,
- a processing means for controlling:
  - the ultrasonic signal; and
  - the audio signal;

wherein, in response to receiving a third instruction for terminating the audio signal, the processing means is configured to:
- decrease the amount of the ultrasonic signal, in the combined signal, from a predetermined value to an essentially zero value over a predetermined disable time-period; and
- upon expiry of the predetermined disable time-period, terminate or remove the audio signal from the combined signal.

Clause 10.

An electronic device comprising:
- a first module for generating an audio signal;
- a second module for generating an ultrasonic signal;
- a third module for generating a second ultrasonic signal;
- a mixer for generating a combined signal;
- a transmitter for outputting an acoustic signal dependent upon the combined signal; and,
- a processing means for controlling:
  - the ultrasonic signal; and
  - the second ultrasonic signal;

wherein, in response to receiving a fifth instruction for replacing the ultrasonic signal, the processing means is configured to:
- decrease in the amount of the ultrasonic signal in the combined signal from a predetermined value to an essentially zero value, the decrease being executed over a predetermined disable time-period; and
- essentially simultaneously to initiating the decrease in the amount of said ultrasonic signal, initiate an increase in the amount of said second ultrasonic signal in the combined signal, said amount of said second ultrasonic signal being increased from an essentially zero value to a predetermined second value over a predetermined replace time-period.

Clause 11.

An electronic device comprising:
- a first module for generating an audio signal;
- a second module for generating an ultrasonic signal;
- a third module for generating a second ultrasonic signal;
- a mixer for generating a combined signal;
- a transmitter for outputting an acoustic signal dependent upon the combined signal;
- a receiver for receiving an echo of the combined signal being reflected by an object; and
- a processing means for:
  - controlling the ultrasonic signal;
  - controlling second ultrasonic signal; and
  - analyzing the echo;

wherein, in response to receiving a fifth instruction for replacing the ultrasonic signal of a predetermined value with the second ultrasonic signal of a predetermined second value, the processing means is configured to:
- interrupt analyzing the echo;
- initiate a decrease in the amount of the ultrasonic signal from the predetermined value to an essentially zero value, the decrease being executed over a predetermined disable time-period; and
- essentially simultaneously to initiating the decrease in the amount of said ultrasonic signal, initiating an increase in the amount of the second ultrasonic signal in the combined signal, said amount of said second ultrasonic signal being increased from an essentially zero value to the predetermined second value over a predetermined replace time-period; and resume analyzing the echo after the expiry of the replace time-period.

Clause 12.

Electronic device according to any of the above clauses, wherein at least one of time-periods: the enable time-period, the disable time-period, the re-enable time-period, and the replace time-period, is in the range from about 1 ms to around 500 ms.

Clause 13.

Electronic device according to clause 12, wherein at least one of the time-periods is in the range from about 5 ms to about 50 ms.

Clause 14.

Electronic device according to clause 12 or 13, wherein at least one of the time-periods is 5 ms or around 5 ms.

Clause 15.

Electronic device according to clause 12 or 13, wherein at least one of the time-periods is 10 ms or around 10 ms.

Clause 16.

A method for reducing the occurrence of pop noise in an acoustic signal generated by a transmitter in an electronic device, the electronic device also comprising a first module, a second module, a mixer, and a processing means, which method comprises:
  generating a combined signal using the mixer; the combined signal being generated dependent upon:
    an ultrasonic signal from the second module; and
    an audio signal from the first module;
  generating, using the transmitter, the acoustic signal dependent upon the combined signal;
  receiving, at the processing means, a first instruction signal for initiating the ultrasonic signal in the combined signal;
  initiating, in response to the first instruction signal, via the processing means an increase in the amount of said ultrasonic signal in the combined signal, wherein
  the amount of the ultrasonic signal in the combined signal is increased from an essentially zero value to the predetermined value over a predetermined enable time-period.

Clause 17.

A method for reducing the occurrence of pop noise in an acoustic signal generated by a transmitter in an electronic device, the electronic device also comprising a first module, a second module, a mixer, and a processing means, which method comprises:
  generating a combined signal using the mixer; the combined signal being generated dependent upon:
    an ultrasonic signal from the second module; and
    an audio signal from the first module;
  generating, using the transmitter, the acoustic signal dependent upon the combined signal;
  receiving, at the processing means, a second instruction signal for terminating the ultrasonic signal from the combined signal;
  initiating, in response to the second instruction signal, via the processing means a decrease in the amount of said ultrasonic signal in the combined signal, wherein
the amount of the ultrasonic signal is decreased from the predetermined value to an essentially zero value over a predetermined disable time-period.

Clause 18.

A method for reducing the occurrence of pop noise in an acoustic signal generated by a transmitter in an electronic device, the electronic device also comprising a first module, a second module, a mixer, and a processing means, which method comprises:
  generating a combined signal using the mixer; the combined signal being generated dependent upon:
    an ultrasonic signal from the second module; and
    an audio signal from the first module;
  generating, using the transmitter, the acoustic signal dependent upon the combined signal;
  receiving, at the processing means, a third instruction signal for terminating the audio signal in the combined signal;
  initiating, in response to the third instruction signal, via the processing means a decrease in the amount of said ultrasonic signal in the combined signal, wherein
  the amount of the ultrasonic signal is decreased from a predetermined value to an essentially zero value over a predetermined disable time-period; and
  terminating or removing, upon expiry of the predetermined disable time-period, the audio signal from the combined signal.

Clause 19.

Method according to clause 18, wherein the method further comprises:
  receiving, at the processing means, a fourth instruction signal for resuming the transmission of the ultrasonic signal in the combined signal;
  initiating, in response to the fourth instruction signal, an increase in the amount of said ultrasonic signal in the combined signal, wherein
  the amount of the ultrasonic signal is increased from an essentially zero value to a predetermined value over a predetermined re-enable time-period.

Clause 20.

A method for reducing the occurrence of pop noise in an acoustic signal generated by a transmitter in an electronic device, the electronic device also comprising a first module, a second module, a third module, a mixer, and a processing means, which method comprises:
  generating a combined signal using the mixer; the combined signal being generated dependent upon:
    an ultrasonic signal from the second module;
    an audio signal from the first module; and
    a second ultrasonic signal from the third module;
  generating, using the transmitter, the acoustic signal dependent upon the combined signal;
  receiving, at the processing means, a fifth instruction for replacing the ultrasonic signal with a second ultrasonic signal in the combined signal;
  initiating, in response to the fifth instruction, via the processing unit a decrease in the amount of the ultrasonic signal in the combined signal, wherein
  the amount of the ultrasonic signal is decreased from a predetermined value to an essentially zero value over a predetermined disable time-period; and
  initiating, essentially simultaneously to initiating the decrease in the amount of the ultrasonic signal, an increase in the amount of the second ultrasonic signal in the combined signal via the second ultrasonic output, wherein
the amount of the second ultrasonic signal is increased from an essentially zero value to a predetermined second value over a predetermined replace time-period.

Clause 21.

A computer readable program code having specific capabilities for executing the method according to any of the clauses 16-20.

Clause 22.

A computer software product comprising instructions that, when executed by a suitable processing means, cause the processing means to:
  control generation of a combined signal using a mixer; the combined signal being generated dependent upon:
    an ultrasonic signal from a second module; and
    an audio signal from a first module;
  control, using a transmitter, generation of an acoustic signal dependent upon the combined signal;
  receive a first instruction signal for initiating the ultrasonic signal in the combined signal;
  initiate, in response to the first instruction signal, an increase in the amount of said ultrasonic signal in the combined signal, wherein
  the amount of the ultrasonic signal in the combined signal is increased from an essentially zero value to the predetermined value over a predetermined enable time-period.

Clause 23.

A computer software product comprising instructions that, when executed by a suitable processing means, cause the processing means to:
  control generation a combined signal using the mixer; the combined signal being generated being dependent upon:
    an ultrasonic signal from a second module; and
    an audio signal from a first module;
  control, using a transmitter, generation of an acoustic signal dependent upon the combined signal;
  receive a second instruction signal for terminating the ultrasonic signal in the combined signal;
  initiate, in response to the second instruction signal, a decrease in the amount of said ultrasonic signal in the combined signal, wherein
the amount of the ultrasonic signal in the combined signal is decreased from the predetermined value to an essentially zero value over a predetermined disable time-period.

Clause 24.

A computer software product comprising instructions that, when executed by a suitable processing means, cause the processing means to:
  control generation of a combined signal using a mixer; the combined signal being generated dependent upon:
    an ultrasonic signal from a second module; and
    an audio signal from a first module;
  control, using a transmitter, generation of an acoustic signal dependent upon the combined signal;
  receive a third instruction signal for terminating the audio signal in the combined signal;
  initiate, in response to the third instruction signal, a decrease in the amount of said ultrasonic signal in the combined signal, wherein
  the amount of the ultrasonic signal is decreased from the predetermined value to an essentially zero value over a predetermined disable time-period; and
  terminate or remove, upon expiry of the predetermined disable time-period, the audio signal in the combined signal.

Clause 25.

The computer software product of clause 24, wherein the processing means is further caused to:
  receive a fourth instruction signal for resuming the transmission of the ultrasonic signal in the combined signal;
  initiate, in response to the fourth instruction signal, an increase in the amount of said ultrasonic signal in the combined signal, wherein
  the amount of the ultrasonic signal is increased from an essentially zero value to a predetermined value over a predetermined re-enable time-period.

Clause 26.

A computer software product comprising instructions that, when executed by a suitable processing means, cause the processing means to:
  control generation of a combined signal using the mixer; the combined signal being generated dependent upon:
    an ultrasonic signal from a second module;
    an audio signal from a first module; and
    a second ultrasonic signal from a third module;
  control, using a transmitter, generation of an acoustic signal dependent upon the combined signal;
  receive a fifth instruction for replacing the ultrasonic signal with a second ultrasonic signal in the combined signal;
  initiate, in response to the fifth instruction, a decrease in the amount of the ultrasonic signal in the combined signal, wherein
  the amount of the ultrasonic signal is decreased from a predetermined value to an essentially zero value over a predetermined disable time-period; and
  initiate, essentially simultaneously to initiating the decrease in the amount of the ultrasonic signal, an increase in the amount of the second ultrasonic signal in the combined signal, wherein
  the amount of the second ultrasonic signal is increased from an essentially zero value to a predetermined second value over a predetermined replace time-period.

Clause 27.

A computer readable medium storing the computer software according to any of the clauses 21-26.

The invention claimed is:

1. A method for reducing the occurrence of pop noise in an acoustic signal generated by a transmitter in an electronic device, the electronic device comprising a first module, a second module, a mixer, and a processor, the method comprising:
  generating a combined signal using the mixer; the combined signal being generated dependent upon:
    an ultrasonic signal from the second module; and
    an audio signal from the first module;
  generating, using the transmitter, the acoustic signal dependent upon the combined signal;
  receiving, at the processor, a first instruction signal for initiating the ultrasonic signal in the combined signal;
  initiating, in response to the first instruction signal, via the processor an increase in the amount of the ultrasonic signal in the combined signal, wherein
  the amount of the ultrasonic signal in the combined signal is increased from an essentially zero value to the predetermined value over a predetermined enable time-period.

2. A computer-program product comprising a computer-usable medium having computer-readable program code embodied therein, the computer-readable program code adapted to be executed to implement the method of claim 1.

3. A method for reducing the occurrence of pop noise in an acoustic signal generated by a transmitter in an electronic device, the electronic device comprising a first module, a second module, a mixer, and a processor, the method comprising:
  generating a combined signal using the mixer; the combined signal being generated dependent upon:
    an ultrasonic signal from the second module; and
    an audio signal from the first module;

generating, using the transmitter, the acoustic signal dependent upon the combined signal;

receiving, at the processor, a second instruction signal for terminating the ultrasonic signal from the combined signal;

initiating, in response to the second instruction signal, via the processor a decrease in the amount of the ultrasonic signal in the combined signal, wherein the amount of the ultrasonic signal is decreased from the predetermined value to an essentially zero value over a predetermined disable time-period.

4. A computer-program product comprising a computer-usable medium having computer-readable program code embodied therein, the computer-readable program code adapted to be executed to implement the method of claim 3.

5. A method for reducing the occurrence of pop noise in an acoustic signal generated by a transmitter in an electronic device, the electronic device comprising a first module, a second module, a mixer, and a processor, the method comprising:

generating a combined signal using the mixer; the combined signal being generated dependent upon:
an ultrasonic signal from the second module; and
an audio signal from the first module;

generating, using the transmitter, the acoustic signal dependent upon the combined signal;

receiving, at the processor, a third instruction signal for terminating the audio signal in the combined signal;

initiating, in response to the third instruction signal, via the processor a decrease in the amount of the ultrasonic signal in the combined signal, wherein the amount of the ultrasonic signal is decreased from a predetermined value to an essentially zero value over a predetermined disable time-period; and terminating or removing, upon expiry of the predetermined disable time-period, the audio signal from the combined signal.

6. The method according to claim 5, wherein the method further comprises:

receiving, at the processor, a fourth instruction signal for resuming the transmission of the ultrasonic signal in the combined signal;

initiating, in response to the fourth instruction signal, an increase in the amount of the ultrasonic signal in the combined signal, wherein the amount of the ultrasonic signal is increased from an essentially zero value to a predetermined value over a predetermined re-enable time-period.

7. A computer-program product comprising a computer-usable medium having computer-readable program code embodied therein, the computer-readable program code adapted to be executed to implement the method of claim 5.

8. The computer-program product of claim 7, wherein the processor is further caused to:

receive a fourth instruction signal for resuming the transmission of the ultrasonic signal in the combined signal; and initiate, in response to the fourth instruction signal, an increase in the amount of the ultrasonic signal in the combined signal, wherein the amount of the ultrasonic signal is increased from an essentially zero value to a predetermined value over a predetermined re-enable time-period.

9. A method for reducing the occurrence of pop noise in an acoustic signal generated by a transmitter in an electronic device, the electronic device comprising a first module, a second module, a third module, a mixer, and a processor, the method comprising:

generating a combined signal using the mixer; the combined signal being generated dependent upon:
an ultrasonic signal from the second module;
an audio signal from the first module; and
a second ultrasonic signal from the third module;

generating, using the transmitter, the acoustic signal dependent upon the combined signal;

receiving, at the processor, a fifth instruction for replacing the ultrasonic signal with a second ultrasonic signal in the combined signal;

initiating, in response to the fifth instruction, via the processing unit a decrease in the amount of the ultrasonic signal in the combined signal, wherein the amount of the ultrasonic signal is decreased from a predetermined value to an essentially zero value over a predetermined disable time-period; and initiating, essentially simultaneously to initiating the decrease in the amount of the ultrasonic signal, an increase in the amount of the second ultrasonic signal in the combined signal via the second ultrasonic output, wherein the amount of the second ultrasonic signal is increased from an essentially zero value to a predetermined second value over a predetermined replace time-period.

10. A computer-program product comprising a computer-usable medium having computer-readable program code embodied therein, the computer-readable program code adapted to be executed to implement the method of claim 9.

* * * * *